(12) United States Patent
Yamauchi et al.

(10) Patent No.: US 12,409,644 B2
(45) Date of Patent: Sep. 9, 2025

(54) SUBSTRATE BONDING METHOD AND SUBSTRATE BONDING SYSTEM

(71) Applicants: BONDTECH CO., LTD., Kyoto (JP); Tadatomo Suga, Tokyo (JP)

(72) Inventors: Akira Yamauchi, Kyoto (JP); Tadatomo Suga, Tokyo (JP)

(73) Assignees: Tadatomo Suga, Tokyo (JP); BONDTECH CO., LTD., Kyoto (JP)

( * ) Notice: Subject to any disclaimer, the term of this patent is extended or adjusted under 35 U.S.C. 154(b) by 211 days.

(21) Appl. No.: 18/245,895

(22) PCT Filed: Sep. 10, 2021

(86) PCT No.: PCT/JP2021/033291
§ 371 (c)(1),
(2) Date: Mar. 19, 2023

(87) PCT Pub. No.: WO2022/070835
PCT Pub. Date: Apr. 7, 2022

(65) Prior Publication Data
US 2024/0009984 A1    Jan. 11, 2024

(30) Foreign Application Priority Data
Sep. 30, 2020   (JP) .................................. 2020-164962

(51) Int. Cl.
*B32B 37/12* (2006.01)
*B32B 37/10* (2006.01)
*B32B 38/10* (2006.01)

(52) U.S. Cl.
CPC .............. *B32B 37/12* (2013.01); *B32B 37/10* (2013.01); *B32B 38/10* (2013.01);
(Continued)

(58) Field of Classification Search
CPC ................................ B32B 37/12; B32B 37/10
See application file for complete search history.

(56) References Cited

U.S. PATENT DOCUMENTS

| 5,385,624 A | 1/1995 | Amemiya et al. |
| 5,421,953 A | 6/1995 | Nagakubo et al. |

(Continued)

FOREIGN PATENT DOCUMENTS

| JP | H04-206719 A | 7/1992 |
| JP | H06-302486 A | 10/1994 |

(Continued)

OTHER PUBLICATIONS

Machine translation JP2007281166A (Year: 2007).*

(Continued)

*Primary Examiner* — Abbas Rashid
*Assistant Examiner* — Wayne K. Swier
(74) *Attorney, Agent, or Firm* — ASLAN LAW, P.C.

(57) ABSTRACT

A substrate bonding method for bonding two substrates includes an activation treatment step of, by subjecting at least one of bonding surfaces to be bonded to each other of respective ones of the two substrates to at least one of reactive ion etching using nitrogen gas and irradiation of nitrogen radicals, activating the bonding surface, a gas exposure step of, after the activation treatment step, exposing the bonding surfaces of the two substrates to gas containing water within a preset standard time, and a bonding step of bonding the two substrates that have the bonding surfaces activated in the activation treatment step.

15 Claims, 29 Drawing Sheets

(52) U.S. Cl.
CPC ....... *B32B 2309/04* (2013.01); *B32B 2309/12* (2013.01); *B32B 2310/0881* (2013.01); *B32B 2310/14* (2013.01)

(56) References Cited

U.S. PATENT DOCUMENTS

| | | | |
|---|---|---|---|
| 2003/0003684 A1* | 1/2003 | Farrens | H01J 37/32165 438/455 |
| 2005/0173057 A1 | 8/2005 | Suga et al. | |
| 2006/0073644 A1 | 4/2006 | Atoji et al. | |
| 2008/0245843 A1 | 10/2008 | Suga et al. | |
| 2010/0201735 A1 | 8/2010 | Sato et al. | |
| 2015/0275349 A1* | 10/2015 | Matsui | B32B 7/12 428/200 |
| 2017/0047225 A1 | 2/2017 | Suga | |
| 2021/0265300 A1 | 8/2021 | Yamauchi et al. | |

FOREIGN PATENT DOCUMENTS

| | | |
|---|---|---|
| JP | 2005-079353 A | 3/2005 |
| JP | 2005-311298 A | 11/2005 |
| JP | 2006-080314 A | 3/2006 |
| JP | 2006-339363 A | 12/2006 |
| JP | 2007-281166 A | 10/2007 |
| JP | 2008-202114 A | 9/2008 |
| JP | 2008-311596 A | 12/2008 |
| JP | 2009-118034 A | 5/2009 |
| WO | WO 2015/163461 | 10/2015 |
| WO | WO 2018/084285 A1 | 5/2018 |
| WO | WO 2020/044579 A1 | 3/2020 |

OTHER PUBLICATIONS

Machine translation JP2009118034A (Year: 2009).*
Machine translation WO2018/084285A1 (Year: 2018).*
Machine translation JP2005079353A (Year: 2005).*
Office Action, issued for the corresponding JP patent application No. 2022-553755, JPO, Japan, Mar. 22, 2023, 8 pages.
Kai Takeuchi et al., Sequential Plasma Activation for Low Temperature Bonding of Aluminosilicate Glass, ECS Journal of Solid State Science and Technology, vol. 10, No. 5, Published May 21, 2021, 9 pages.

* cited by examiner

SUBSTRATE BONDING METHOD AND SUBSTRATE BONDING SYSTEM

CROSS-REFERENCE TO RELATED APPLICATIONS

This application claims priority to JP Patent Application No. 2020-164962 filed on Sep. 30, 2020, and this application claims priority to and is a 371 of international PCT Application No. PCT/JP2021/033291 filed on Sep. 10, 2021, the entire contents of which are hereby incorporated by reference.

TECHNICAL FIELD

The present disclosure relates to a substrate bonding method and a substrate bonding system.

BACKGROUND ART

Conventionally, in hydrophilic bonding between substrates, attaching substrates to each other with water molecules interposed therebetween in the air enabled, even when a sufficient number of OH groups were not formed on the bonding surfaces of the original substrates, water molecule interposed between the bonding surfaces of the substrates to be converted to OH groups and heating enabled bonds between the bonding surfaces to be converted to strong covalent bonds. However, since, when substrates are bonded in the air, a large void occurs due to drawing-in of air, it has been required to employ a bonding method of attaching substrates to each other while warping central portions of the substrates. However, in the case of this bonding method, there has been a problem in that a substrate is distorted, alignment precision between substrates deteriorates, and the like. In addition, there is another problem in that, since substrates are bonded with water molecules interposed between interfaces of the substrates, heating the substrates causes microvoids to occur. For that reason, preventing drawing-in of air into between substrates by bonding substrates to each other in a vacuum enables a void to be prevented from occurring. Further, since bonding substrates to each other in a vacuum causes the substrates to be bonded with water molecules existing between the substrates expelled, no microvoid occurs. The above-described method for bonding substrates to each other in a vacuum is an effective method to achieve an excellent bonding between substrates. However, it is required to generate a sufficient number of OH groups on the bonding surfaces of substrates when the bonding surfaces of the substrates are activated before the substrates are bonded to each other. In a conventional treatment in which the bonding surfaces of substrates are activated by only performing RIE treatment and exposing the bonding surfaces to atmospheric air, a sufficient number of OH groups are not generated on the bonding surfaces of the substrates and bonding strength of the bonded substrates becomes insufficient. In consideration of the above situation, as activation treatment of the bonding surfaces of substrates, a method in which a sufficient number of OH groups enabling bonding in a vacuum can be generated has been requested.

On the other hand, a substrate bonding method for bonding two substrates to each other by subjecting the bonding surfaces to be bonded to each other of two substrates to reactive ion etching and irradiation of radicals in combination has been proposed (see, for example, Patent Literature 1). This substrate bonding method is a method for bonding two substrates to each other by generating hydroxyl groups (OH groups) on the bonding surfaces of the two substrates and causing hydrogen bonds to be formed between the bonding surfaces by bringing the bonding surfaces of the two substrates into contact with each other and applying pressure to the substrates. In this substrate bonding method, after the bonding surfaces to be bonded to each other of the two substrates are subjected to reactive ion etching by exposing the bonding surfaces to oxygen plasma, the bonding surfaces of the two substrates are irradiated with nitrogen radicals. Subsequently, by bringing the bonding surfaces of the two substrates into contact with each other and applying pressure to the substrates, the two substrates are bonded to each other.

CITATION LIST

Patent Literature

Patent Literature 1: Unexamined Japanese Patent Application Publication No. 2005-79353

SUMMARY OF INVENTION

Technical Problem

However, in the substrate bonding method described in Patent Literature 1, the number of OH groups generated on the bonding surfaces of the two substrates is insufficient, and bonding strength between the bonded two substrates is sometimes insufficient. Hence, a substrate bonding method that is capable of, by generating a sufficient number of OH groups on the bonding surfaces of two substrates, more firmly bonding the two substrates to each other is requested.

The present disclosure has been made in consideration of the above-described conditions, and an objective of the present disclosure is to provide a substrate bonding method and a substrate bonding system that are capable of firmly bonding two substrates to each other.

Solution to Problem

In order to achieve the above-described objective, a substrate bonding method according to the present disclosure is
a substrate bonding method for bonding two substrates and includes:
an activation treatment step of, by subjecting at least one of bonding surfaces to be bonded to each other of respective ones of the two substrates to at least one of etching treatment using nitrogen gas and irradiation of nitrogen radicals, activating the bonding surface;
a gas exposure step of, after the activation treatment step, exposing the bonding surfaces of the two substrates to gas containing water within a preset standard time; and
a bonding step of bonding the two substrates that have the bonding surfaces activated in the activation treatment step.

A substrate bonding system according to another aspect of the present disclosure is
a substrate bonding system for bonding two substrates and includes:
an activation treatment device to perform activation treatment to, by subjecting at least one of bonding surfaces to be bonded to each other of respective ones of the two substrates to at least one of etching treatment using nitrogen gas and irradiation of nitrogen radicals, activate the bonding surface and subsequently expose the bonding surfaces of the two substrates to gas containing water within a preset standard time; and a substrate bonding device to bond the two substrates that have the bonding surfaces activated by the activation treatment device.

Advantageous Effects of Invention

According to the present disclosure, by subjecting at least one of bonding surfaces to be bonded to each other of respective ones of two substrates to at least one of reactive ion etching using nitrogen gas and irradiation of nitrogen radicals, the bonding surface of the substrate is activated. On this occasion, by nitrogen plasma or nitrogen radical treatment, a state in which nitrogen is adsorbed on the surface or an oxynitride is formed on the surface is formed on the surface of the substrate. This state is herein referred to as an N-activated state. The N-activated state reacts with water and forms OH groups and thereby contributes to increase in bonding strength. However, since the N-activated state formed on the bonding surface of the substrate is unstable and is to be deactivated when left untreated. As a result, the bonding strength cannot be maintained. Therefore, the bonding surfaces are required to be in contact with water molecules within a predetermined standard time after the bonding surfaces of the substrates are activated. Thus, in the present disclosure, the bonding surfaces of the substrates are exposed to gas containing water within a predetermined standard time after the bonding surfaces of the substrates are activated. Since, through this processing, it is possible to cause the bonding surfaces of the substrates to come into contact with water molecules while being N-activated, a large number of oxynitrides can be formed on the bonding surfaces of the substrates. When heat treatment is performed after two substrates are temporarily bonded by bringing the bonding surfaces of the two substrates into contact with each other, a large number of oxynitrides existing between the bonding surfaces of the two substrates being replaced by OH groups enable a comparatively large number of hydrogen bonds to be formed. Therefore, when hydrogen bonds formed between the bonding surfaces of the two substrates temporarily bonded to each other are converted to covalent bonds, the two substrates are bonded to each other via a comparatively large number of covalent bonds, as a result of which it is possible to increase the bonding strength between the two substrates.

Figure 13:
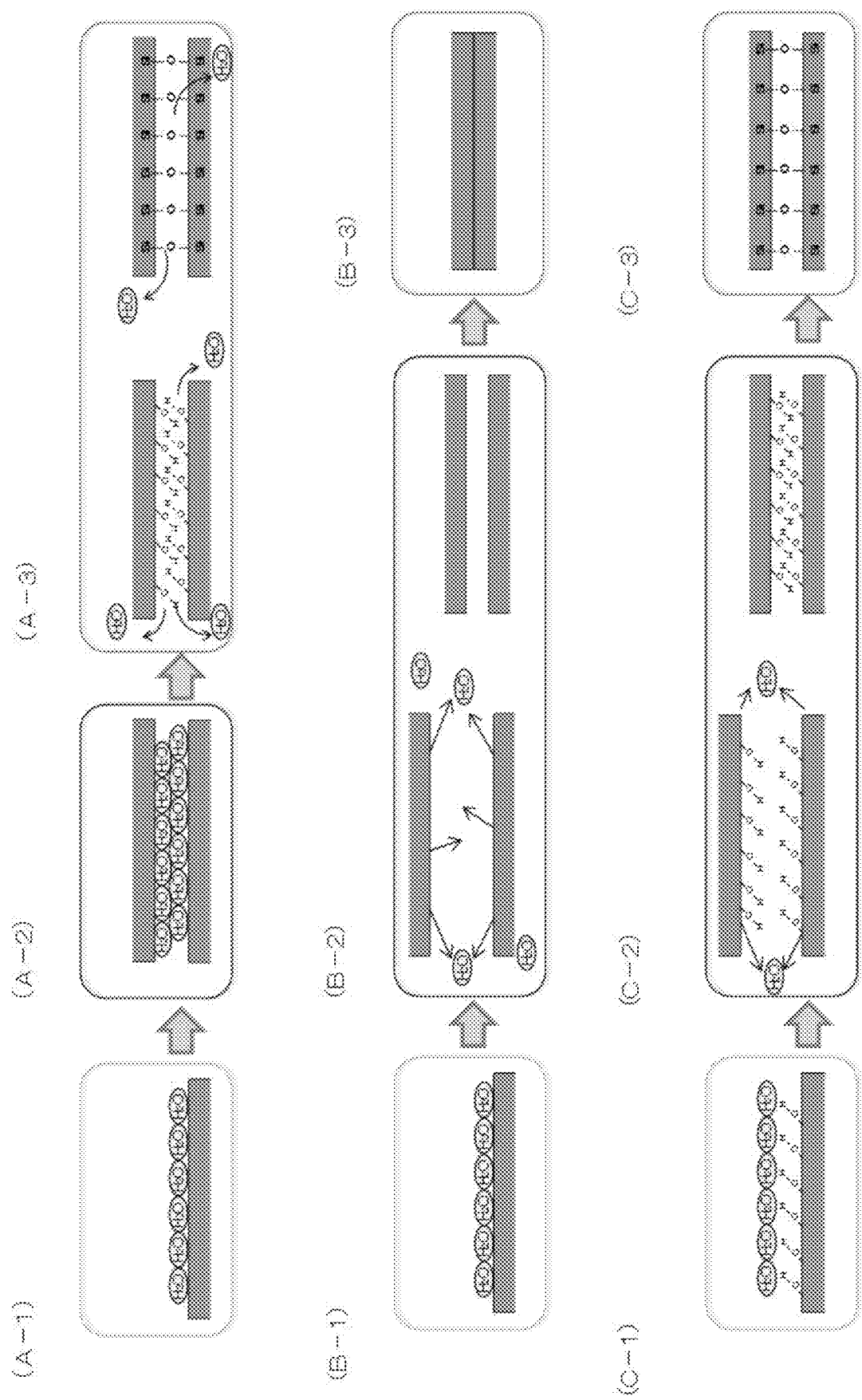
Figure 14:
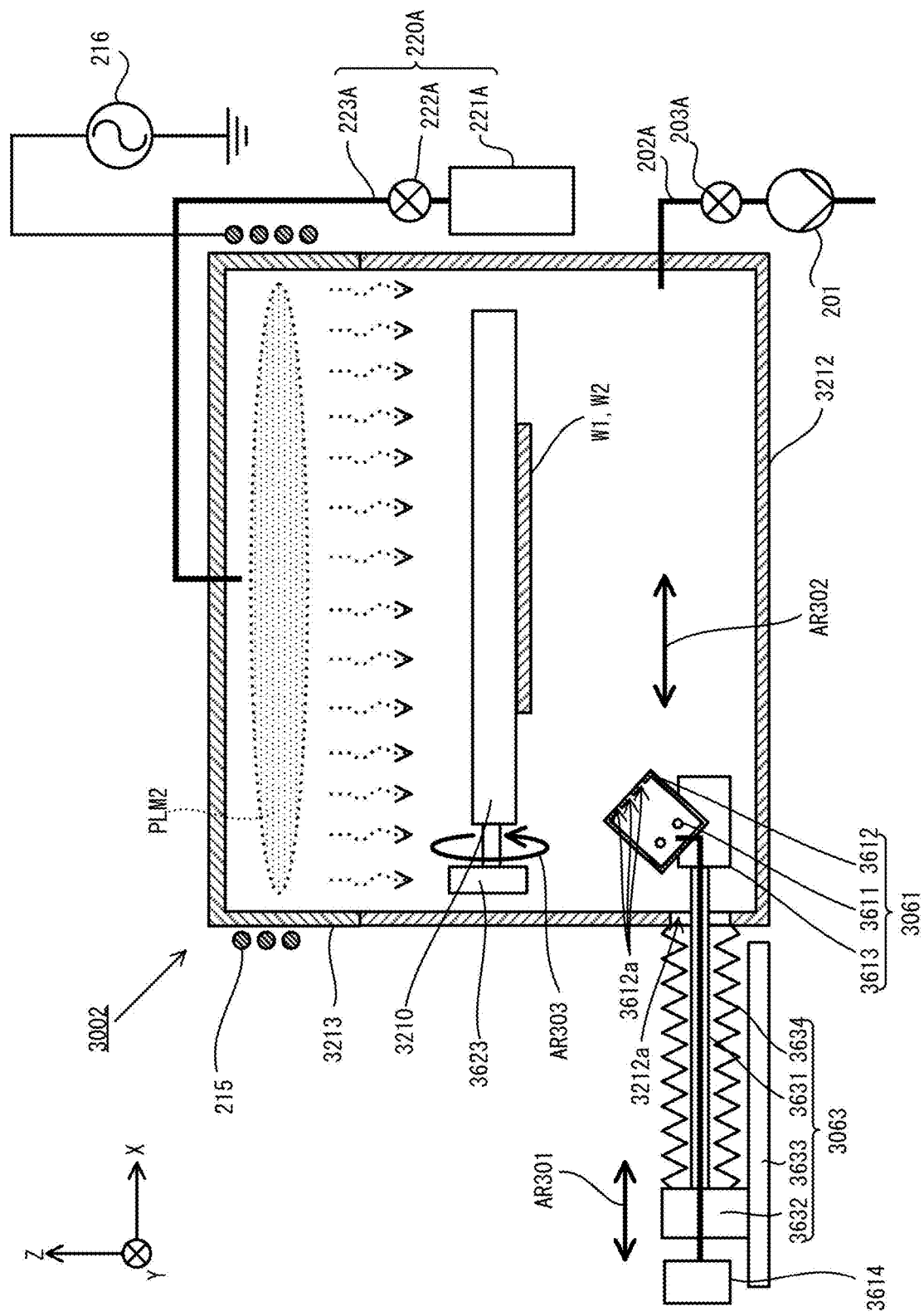
Figure 15A:
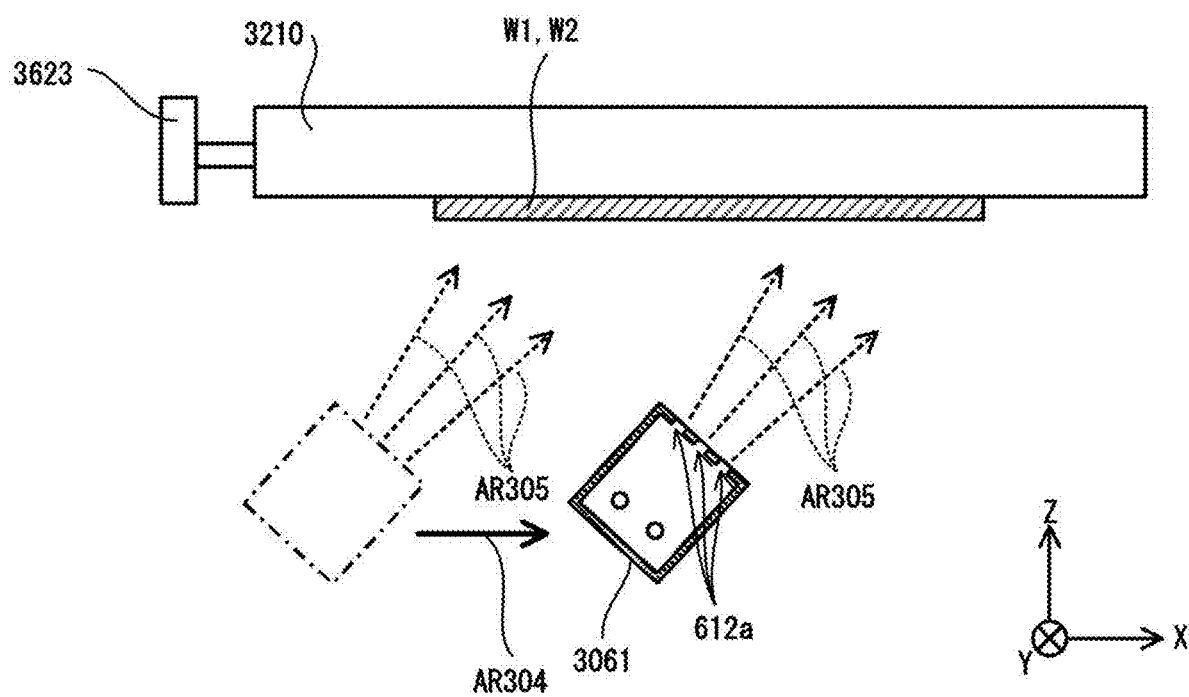
Figure 15B:
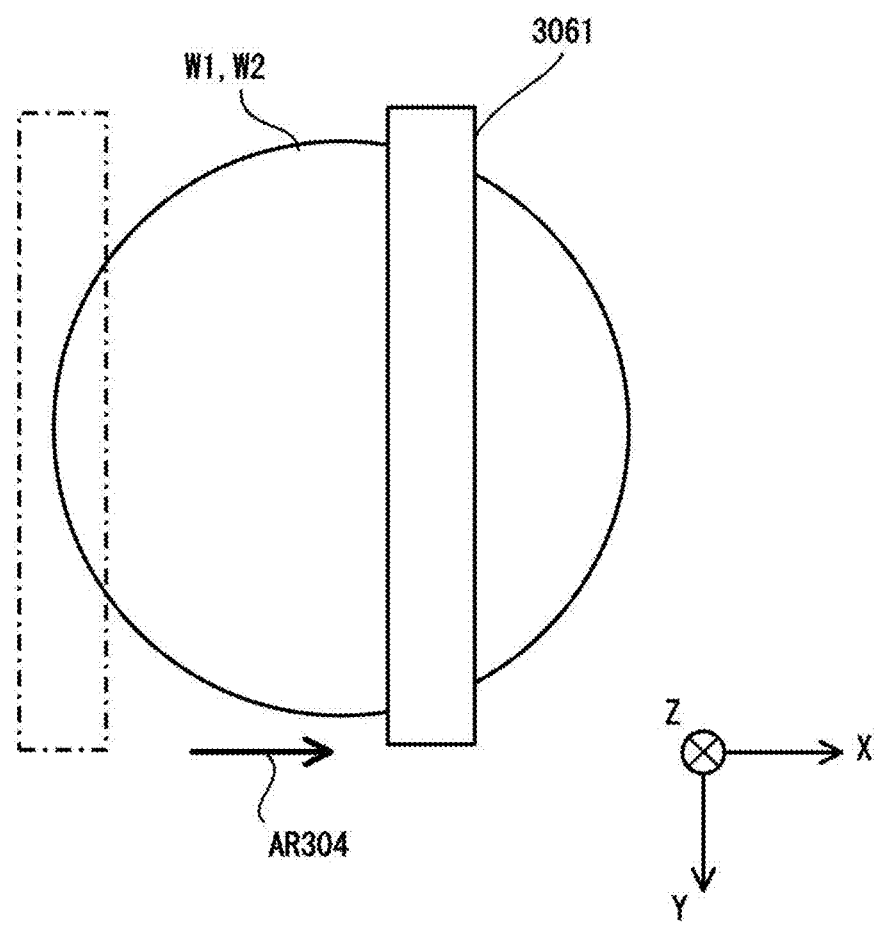
Figure 16A:
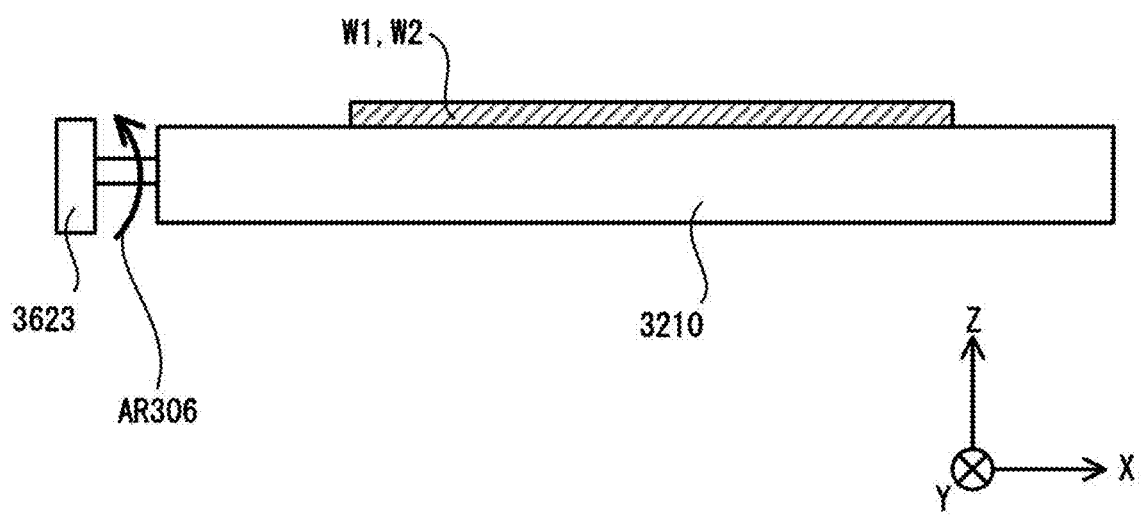
Figure 16B:
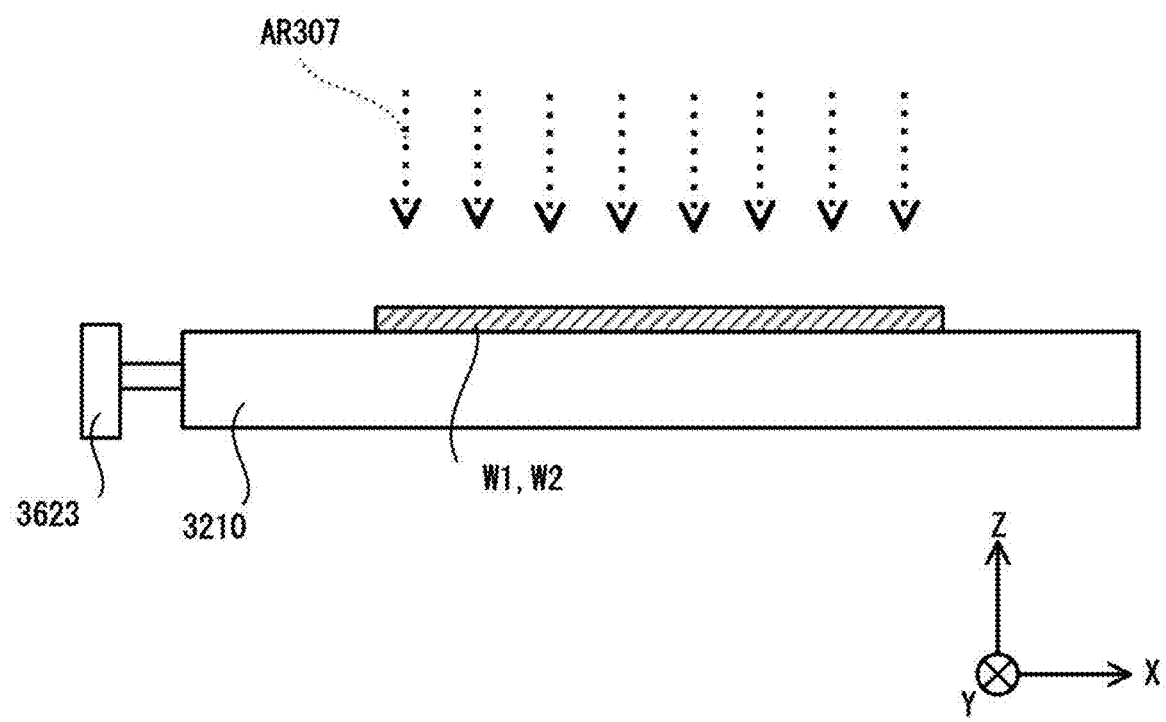
Figure 17:
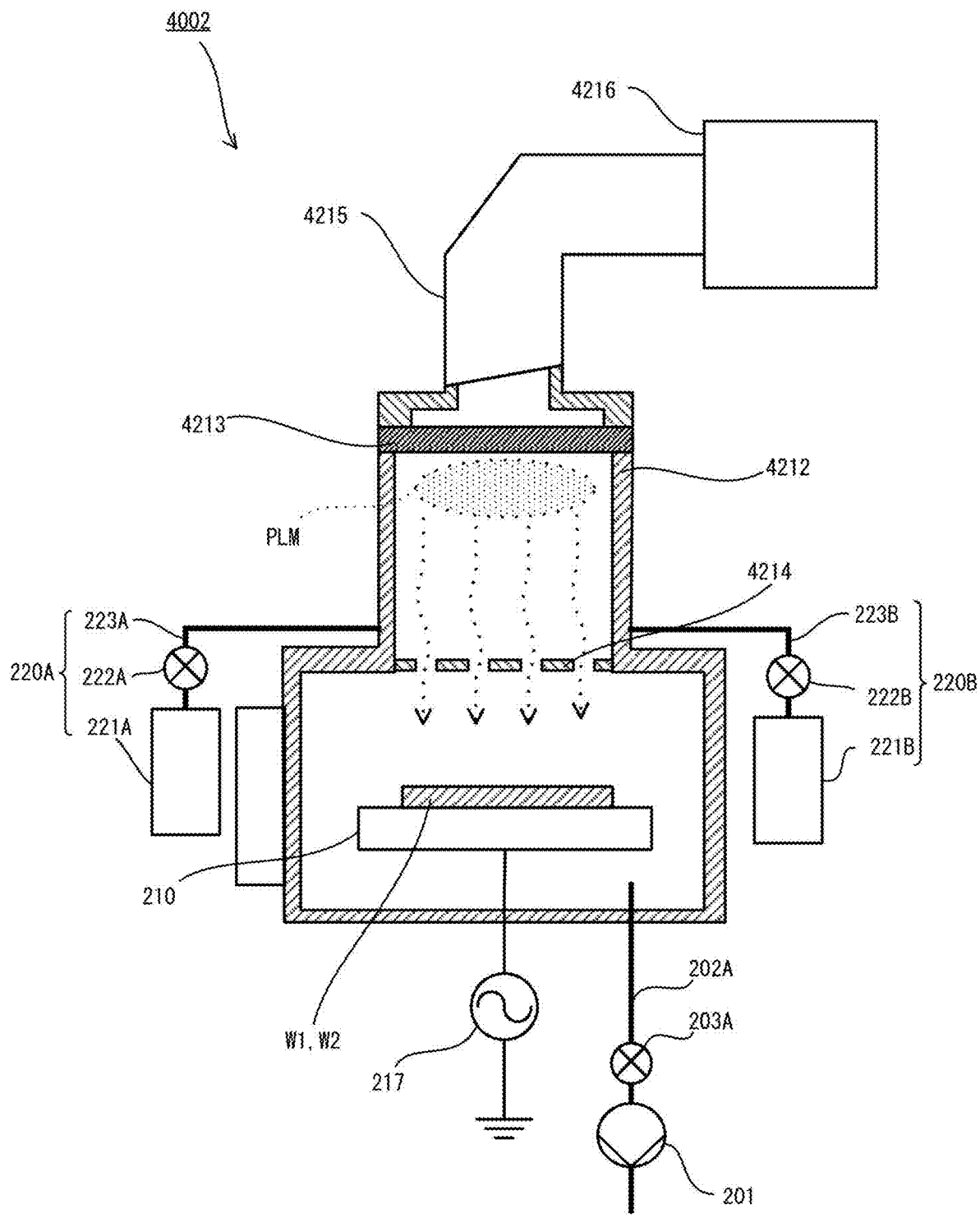
Figure 18:
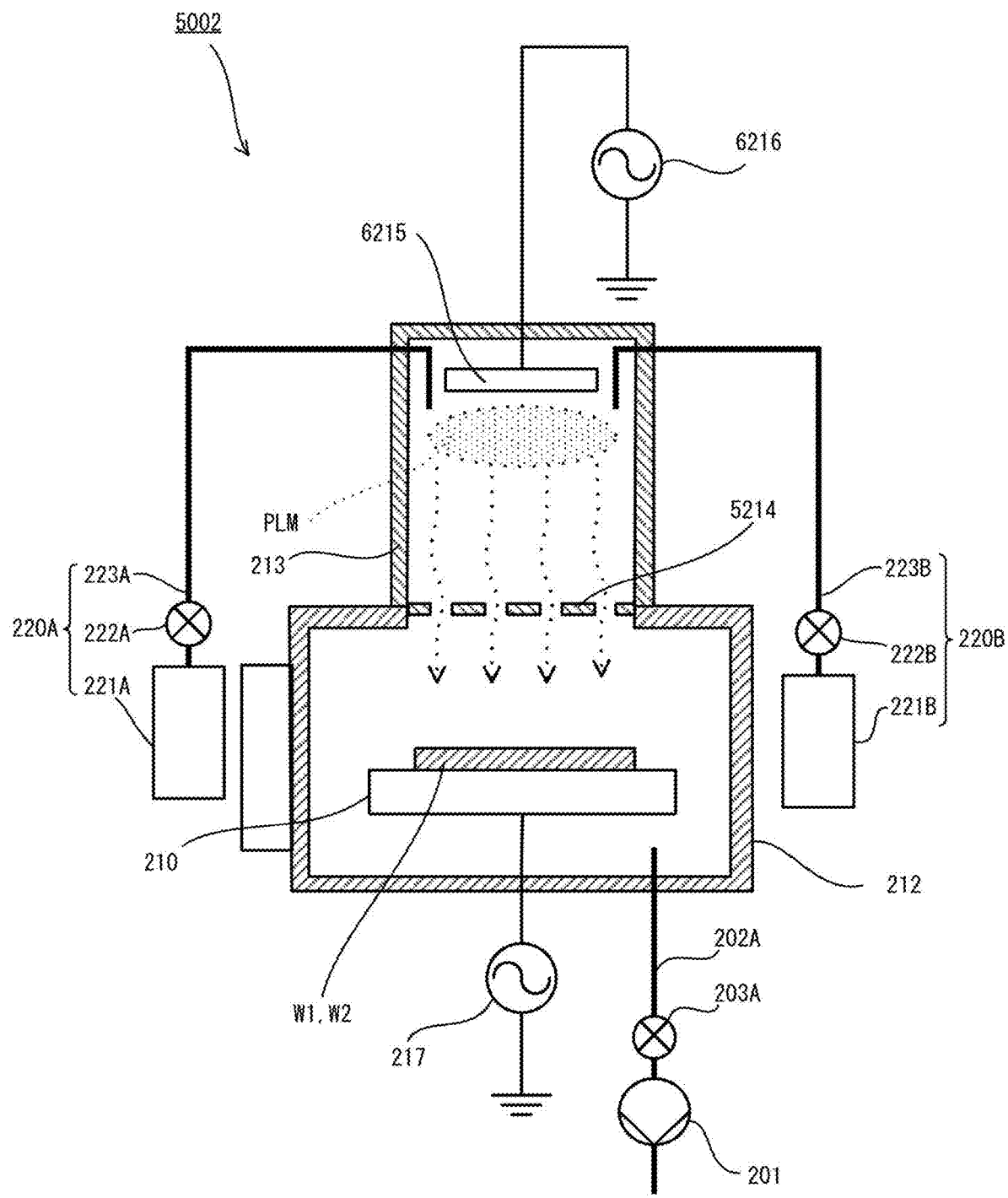

Section (A-1) of FIG. 13 is a schematic diagram illustrating a manner in which water molecules adhere to a substrate, section (A-2) of FIG. 13 is a schematic diagram illustrating a state in which substrates are brought into contact with each other under atmospheric pressure, section (A-3) of FIG. 13 is a schematic diagram illustrating a state transition of the substrates in the case where heat treatment is performed under atmospheric pressure, section (B-1) of FIG. 13 is a schematic diagram illustrating a manner in which water molecules adhere to a substrate, section (B-2) of FIG. 13 is a schematic diagram illustrating a state transition of substrates when the substrates are brought close to each other under reduced pressure, section (B-3) of FIG. 13 is a schematic diagram illustrating a state in which the substrates are brought into contact with each other under reduced pressure, section (C-1) of FIG. 13 is a schematic diagram illustrating a state of a substrate after an activation treatment step according to the present embodiment, section (C-2) of FIG. 13 is a schematic diagram illustrating a state transition of substrates in a bonding step according to the present embodiment, and section (C-3) of FIG. 13 is a schematic diagram illustrating a state in which the substrates are brought into contact with each other in the bonding step according to the present embodiment;

FIG. 14 is a schematic front view of an activation treatment device according to a variation;

FIG. 15A is an operation explanatory diagram of the activation treatment device according to the variation;

FIG. 15B is a plan view of a portion of the activation treatment device according to the variation;

FIG. 16A is an operation explanatory diagram of a stage of the activation treatment device according to the variation;

FIG. 16B is a diagram for a description of radical treatment in the activation treatment device according to the variation;

FIG. 17 is a schematic front view of an activation treatment device according to another variation; and FIG. 18 is a schematic front view of an activation treatment device according to still another variation.

DESCRIPTION OF EMBODIMENTS

A substrate bonding system according to an embodiment of the present disclosure is described below, referring to the drawings. The substrate bonding system according to present embodiment is a system that, by, after subjecting bonding surfaces of two substrates to activation treatment in a chamber under reduced pressure, bringing the substrates into contact with each other and applying pressure to and heating the substrates, bonds the two substrates to each other. In the activation treatment, by subjecting at least one of the bonding surfaces to be bonded to each other of the respective ones of the two substrates to at least one of reactive ion etching using nitrogen gas and irradiation of nitrogen radicals, the bonding surface of the substrate is activated.

Figure 1:
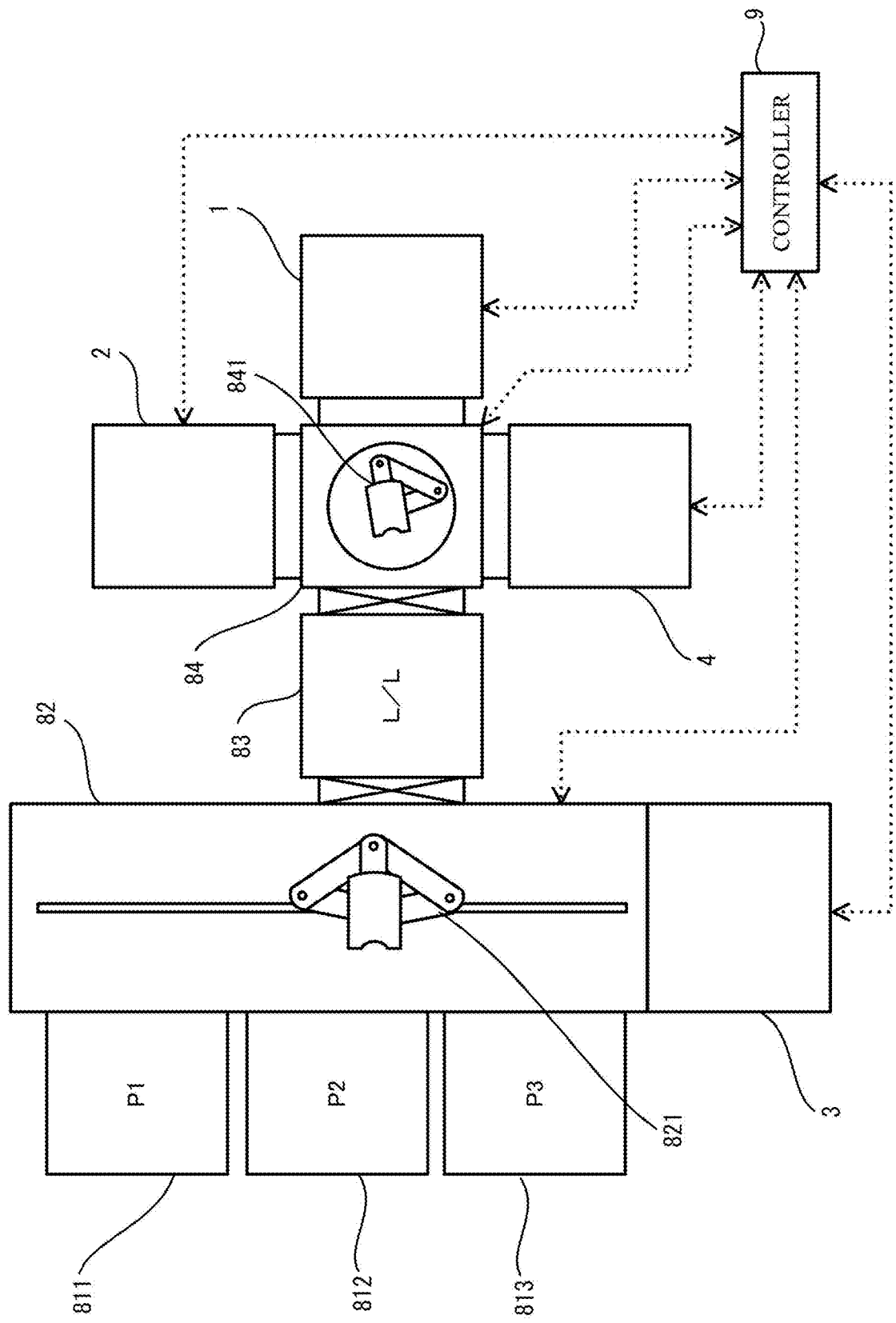
FIG. 1 is a schematic configuration diagram of a substrate bonding system according to an embodiment of the present disclosure.

The substrate bonding system according to the present embodiment includes feeding ports 811 and 812, a take-out port 813, a first transportation device 82, a cleaning device 3, a turnover device 4, an activation treatment device 2, a substrate bonding device 1, a second transportation device 84, a controller 9, and a load lock chamber 83, as illustrated in FIG. 1. The controller 9 controls the first transportation device 82, the cleaning device 3, the turnover device 4, the activation treatment device 2, the substrate bonding device 1, and the second transportation device 84. In each of the first transportation device 82, the second transportation device 84, and the cleaning device 3, a high efficiency particulate air (HEPA) filter (not illustrated) is installed. Because of this configuration, the insides of the first transportation device 82, the second transportation device 84, and the cleaning device 3 are maintained at an atmospheric pressure environment that contains an extremely small number of particles.

The first transportation device 82 includes a transportation robot 821 including an arm at the tip portion of which a holder to hold a substrate is disposed. The transportation robot 821 is capable of moving along a direction in which the feeding ports 811 and 812 and the take-out port 813 are arranged and also capable of changing the direction of the tip portion of the arm by turning. The second transportation device 84 also includes a transportation robot 841 including an arm at the tip portion of which a holder to hold a substrate is disposed. The transportation robot 841 is capable of changing the direction of the tip portion of the arm by turning. In addition, each of the holders includes a vacuum chuck, an electrostatic chuck, or the like and sucks and holds the opposite side to the bonding surface side of a substrate.

In the load lock chamber 83, a cooling device (not illustrated) that cools a stage (not illustrated) that supports substrate W1 or W2 is disposed. When, for example, temperature and humidity inside the load lock chamber 83 are set in such a manner that, when the temperature is 25° C., the humidity becomes 50%, the cooling device cooling the stage to 18° C. causes the humidity in a vicinity of the substrate W1 or W2 placed on the stage to be controlled to approximately 80%.

The cleaning device 3 cleans a transported substrate while discharging fluid, such as water and cleaning fluid, to the substrate. The cleaning device 3 includes a stage (not illustrated) to support a substrate, an XY-direction driver (not illustrated) to drive the stage in two directions (XY-directions) that are orthogonal to the vertical direction and are orthogonal to each other, and a cleaning head (not illustrated) to discharge water to which ultrasonic waves or megasonic vibration is applied or cleaning fluid. The cleaning device 3 also includes a rotation driver (not illustrated) to rotate the stage within a plane that is orthogonal to the vertical direction. The cleaning device 3, while spraying water to which ultrasonic waves are applied on the bonding surface of a substrate by use of the cleaning head, causes the stage to scan in XY directions and cleans the entire bonding surface of the substrate. The cleaning device 3, after stopping the discharge of water by the cleaning head, spin-dries the substrate by rotating the stage.

The turnover device 4 includes a substrate holder (not illustrated) to receive a substrate from the tip portion of the arm of the transportation robot 841 and hold the received substrate and a driver (not illustrated) to turn over the substrate holder with the substrate holder holding the substrate. The substrate holder includes a vacuum chuck, an electrostatic chuck, or the like to hold, for example, the opposite side to the bonding surface side of a substrate. When the substrate holder receives a substrate from the tip portion of the arm of the transportation robot 841 in such an attitude that the bonding surface of the substrate faces vertically upward, the turnover device 4 turns over the substrate holder and holds the substrate in such an attitude that the bonding surface of the substrate faces vertically downward. The turnover device 4 hands over the substrate to the tip portion of the arm of the transportation robot 841 in such an attitude that the bonding surface of the substrate faces vertically downward.

Figure 2:
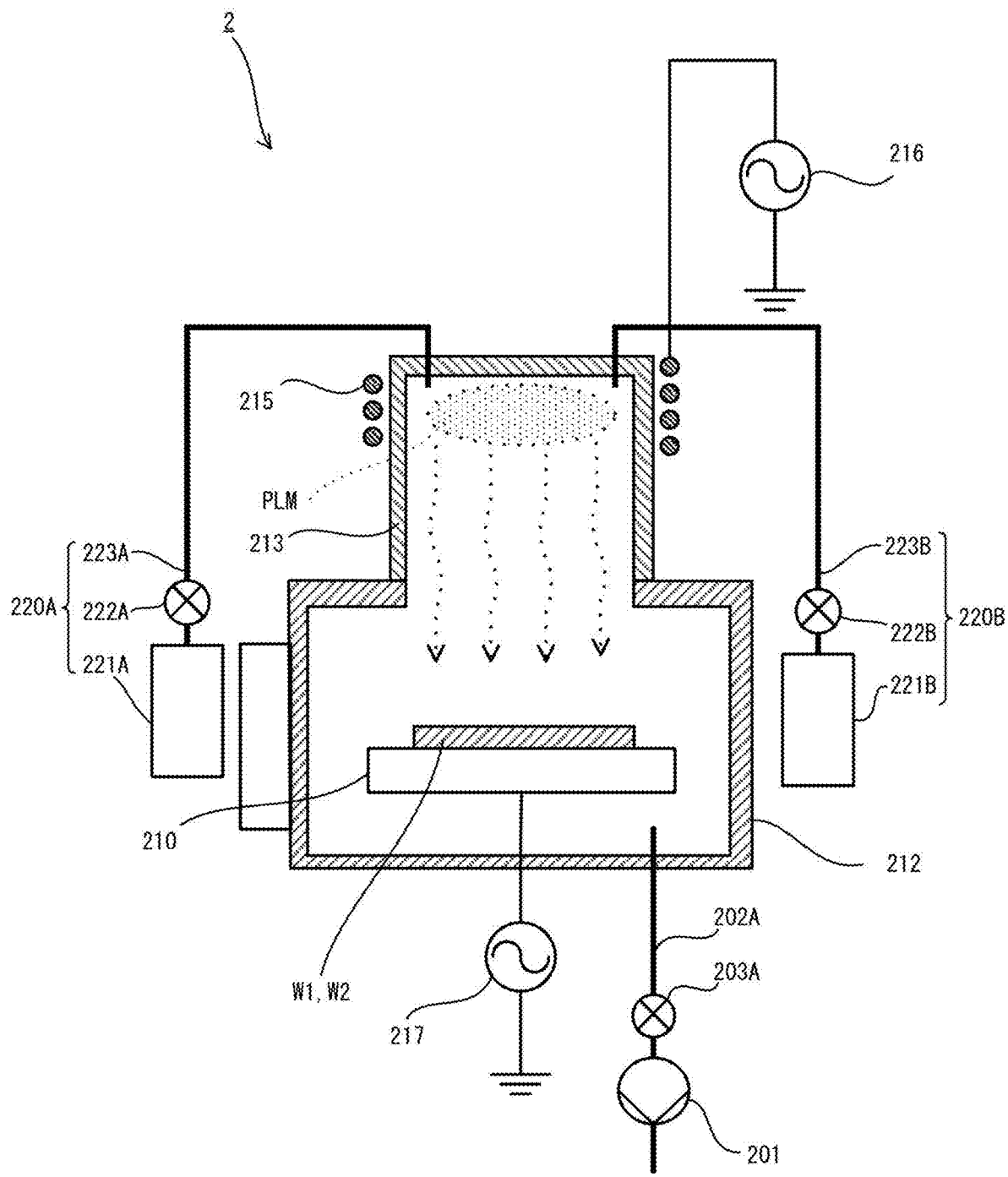
FIG. 2 is a schematic front view of an activation treatment device according to the embodiment.

The activation treatment device 2, by subjecting the bonding surface of a substrate to at least one of reactive ion etching using nitrogen gas and irradiation of nitrogen radicals, performs activation treatment to activate the bonding surface. The activation treatment device 2 is a device that generates inductively coupled plasma (ICP), and, as illustrated in FIG. 2, includes a stage 210, a chamber 212, a plasma chamber 213, an induction coil 215 wound on the outer side of the plasma chamber 213, and a high-frequency power source 216 to supply high-frequency current to the induction coil 215. The plasma chamber 213 is formed of, for example, quartz glass. The activation treatment device 2 also includes a nitrogen gas feeder 220A and an oxygen gas feeder 220B. The nitrogen gas feeder 220A includes a nitrogen gas storage 221A, a feeding valve 222A, a feeding pipe 223A, and a bias applier 217. The oxygen gas feeder 220B includes an oxygen gas storage 221B, a feeding valve 222B, and a feeding pipe 223B. On the stage 210, a substrate W1 or W2 is placed. The chamber 212 communicates with the inside of the plasma chamber 213. The chamber 212 is connected to a vacuum pump 201 via an exhaust pipe 202A and an exhaust valve 203A. When the exhaust valve 203A is put into the open state and the vacuum pump 201 is caused to operate, gas in the chamber 212 is exhausted to the outside of the chamber 212 through the exhaust pipe 202A and gas pressure in the chamber 212 is reduced (decompressed).

As the high-frequency power source 216, a power source that supplies the induction coil 215 with a high-frequency current having a frequency of, for example, 27 MHz can be employed. When high-frequency current is supplied to the induction coil 215 while $N_2$ gas has been fed into the plasma chamber 213, plasma PLM is formed in the plasma chamber 213. Since, on this occasion, ions contained in the plasma are trapped in the plasma chamber 213 by the induction coil 215, the activation treatment device 2 may have a configuration in which there is no trap plate at a portion between the plasma chamber 213 and the chamber 212. The induction coil 215, the high-frequency power source 216, and the nitrogen gas feeder 220A constitute a plasma generation source that generates plasma PLM in the plasma chamber 213 and supplies the bonding surface of the substrate W1 or W2 supported by the stage 210 with $N_2$ radicals in the plasma. Note that, although an example in which the activation treatment device 2 is a device that includes the induction coil 215 and the high-frequency power source 216 and generates ICP is described herein, the activation treatment device 2 is not limited to the example, and the activation treatment device 2 may instead be a device that includes a flat plate electrode arranged outside the plasma chamber 213, a high-frequency power source electrically connected to the flat plate electrode, and a trap plate arranged at a portion between the plasma chamber 213 and the chamber 212 and configured to trap ions in the plasma and generates capacitively coupled plasma (CCP). In this case, as the high-frequency power source, a power source that applies a high-frequency bias having a frequency of, for example, 27 MHz can be employed. Power supplied from the high-frequency power source into the plasma chamber is set to, for example, 250 W.

The bias applier 217 is a high-frequency power source that applies a high-frequency bias to the substrate W1 or W2 supported by the stage 210. As the bias applier 217, a power source that generates a high-frequency bias having a frequency of, for example, 13.56 MHz can be employed. Applying a high-frequency bias to the substrate W1 or W2 by the bias applier 217 as described above causes a sheath region in which ions with kinetic energy repeatedly collide with the substrate W1 or W2 to be generated in a vicinity of the bonding surface of the substrate W1 or W2. The bonding surface of the substrate W1 or W2 is etched by ions with kinetic energy existing in the sheath region. In addition, the activation treatment device 2, after performing the afore-described activation treatment, exposes the bonding surface of the substrate W1 or W2 to gas containing water within a preset standard time. In this configuration, examples of the gas containing water include atmospheric air and water gas. To the chamber 212, a feeding pipe (not illustrated) to feed air or water gas into the chamber 212 is connected, and a feeding valve (not illustrated) is interposed in the feeding pipe. The activation treatment device 2, by feeding atmospheric air or water gas into the chamber 212 by putting the exhaust valve 203A into the closed state and the feeding valve into the open state, exposes the bonding surface of the substrate W1 or W2 to atmospheric air or water gas. When water gas is fed, a water gas feeder (not illustrated) to feed water gas into the feeding pipe is connected. The water gas feeder is only required to be a feeder that generates water gas by mixing carrier gas, such as argon (Ar), nitrogen ($N_2$), helium (He), and oxygen ($O_2$), and vaporized water and feeds the generated water gas. In the present embodiment, nitrogen is employed as a carrier gas and a gas generated by mixing 50% vaporized water with the carrier gas is employed as water gas.

Figure 3:
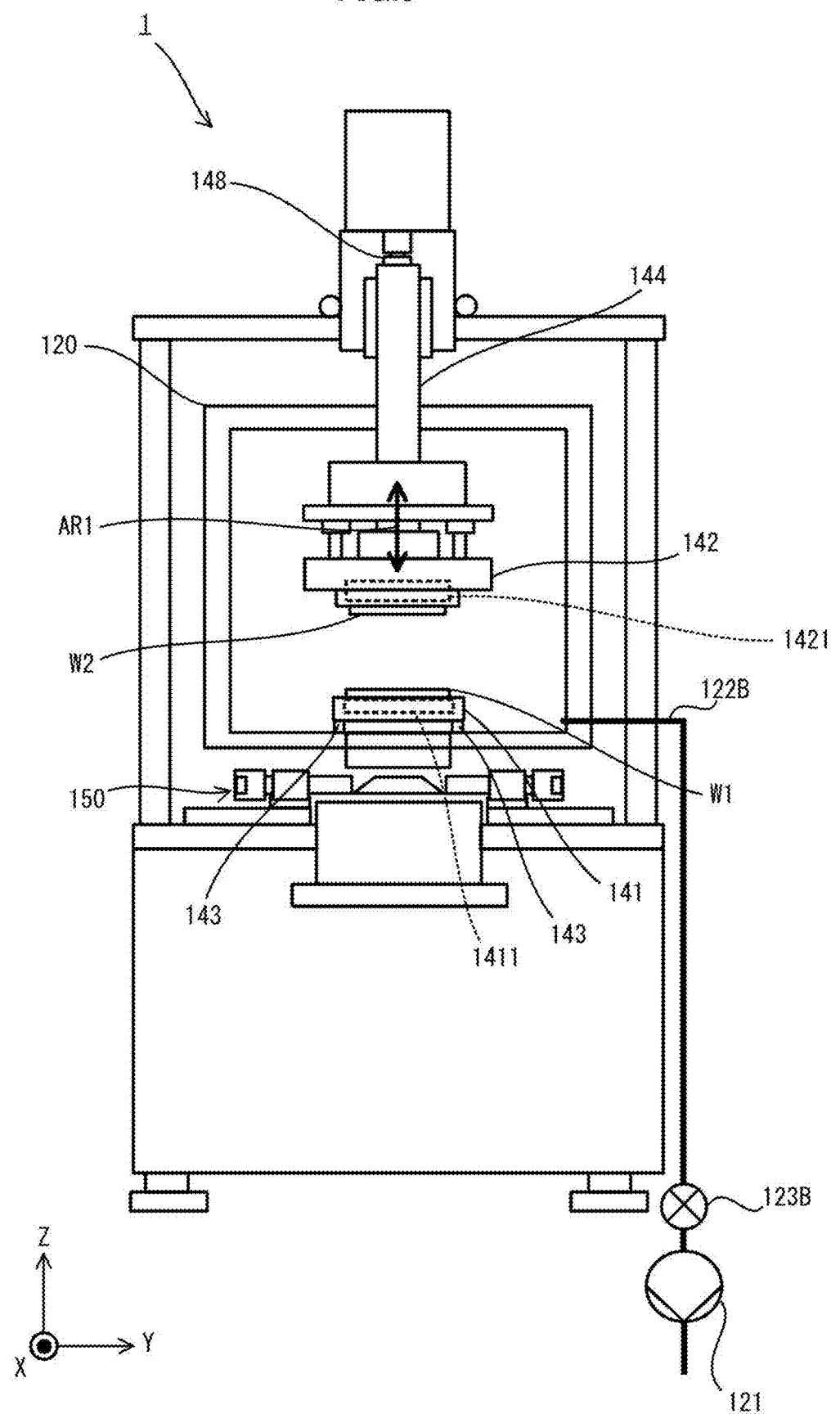
FIG. 3 is a schematic front view of a substrate bonding device according to the embodiment.

The substrate bonding device 1 bonds the substrates W1 and W2 having been subjected to the activation treatment in the activation treatment device 2 to each other. The substrate bonding device 1 includes a chamber 120, a stage 141, a head 142, a stage driver 143, a head driver 144, substrate heaters 1411 and 1421, and a misalignment amount measurer 150, as illustrated in FIG. 3. Note that the following description is made appropriately assuming that the ±Z-directions and an XY-direction in FIG. 3 are the vertical direction and a horizontal direction, respectively. The chamber 120 is connected to a vacuum pump 121 via an exhaust pipe 122B and an exhaust valve 123B. When the exhaust valve 123B is put into the open state and the vacuum pump 121 is caused to operate, gas in the chamber 120 is exhausted to the outside of the chamber 120 through the exhaust pipe 122B and gas pressure in the chamber 120 is reduced (decompressed). In addition, by varying an opening/closing amount of the exhaust valve 123B and thereby adjusting an exhaust amount, gas pressure (a degree of vacuum) in the chamber 120 can be adjusted. Further, to the chamber 120, an air feeding pipe (not illustrated) is connected, and an air feeding valve (not illustrated) is interposed in the air feeding pipe. The substrate bonding device 1, by putting the exhaust valve 123B into the closed state and the air feeding valve into the open state, brings air pressure in the chamber 120 to an atmospheric pressure.

The stage 141 and the head 142 are arranged to face each other in the Z-direction in the chamber 120. The stage 141 supports the substrate W1 on the upper surface thereof, and the head 142 supports the substrate W2 on the lower surface thereof. Note that the upper surface of the stage 141 and the lower surface of the head 142 may be subjected to surface roughening processing in consideration of a case where, when contact surfaces of the substrates W1 and W2 with the stage 141 and the head 142 are mirror surfaces, the substrates W1 and W2 are unlikely to be separated from the stage 141 and the head 142, respectively. The stage 141 and the head 142 have holding mechanisms (not illustrated) to hold the substrates W1 and W2, respectively. Each of the holding mechanisms includes an electrostatic chuck, a vacuum chuck, or the like.

The stage driver 143 is capable of moving the stage 141 in an XY direction and rotating the stage 141 about the Z-axis. The head driver 144 causes the head 142 to ascend and descend in the vertical direction (see an arrow AR1 in FIG. 3). The head driver 144, by moving the head 142 downward, brings the head 142 close to the stage 141. In addition, the head driver 144, by moving the head 142 upward, separates the head 142 away from the stage 141. When the head driver 144 applies drive force to the head 142 in a direction in which the head 142 comes close to the stage 141 while the substrates W1 and W2 are in contact with each other, the substrate W2 is pressed against the substrate W1. In addition, to the head driver 144, a pressure sensor 148 to measure drive force that the head driver 144 applies to the head 142 in a direction in which the head 142 comes close to the stage 141 is disposed. The pressure sensor 148 is, for example, a load cell, and pressure exerted on the bonding surfaces of the substrates W1 and W2 when the substrate W2 is pressed against the substrate W1 by the head driver 144 can be detected from a measured value detected by the load cell.

The substrate heaters 1411 and 1421 respectively include, for example, electrothermal heaters. The substrate heaters 1411 and 1421 heat the substrates W1 and W2 by transmitting heat to the substrates W1 and W2 supported by the stage 141 and the head 142, respectively. In addition, the substrate heaters 1411 and 1421 is capable of adjusting the temperature of the substrates W1 and W2 or the bonding surfaces thereof by adjusting the amounts of heat generation by the substrate heaters 1411 and 1421, respectively. The misalignment amount measurer 150, by recognizing positions of marks for position alignment (alignment marks) that are disposed on the respective ones of the substrates W1 and W2, measures a misalignment amount in a horizontal direction of the substrate W1 with respect to the substrate W2. The misalignment amount measurer 150 recognizes the alignment marks of the substrates W1 and W2, using, for example, light (for example, infrared light) transmitted through the substrates W1 and W2. The stage driver 143, by moving the stage 141 in a horizontal direction or rotating the stage 141, based on a misalignment amount measured by the misalignment amount measurer 150, executes mutual positioning operation (alignment operation) between the substrates W1 and W2. Both the measurement of a misalignment amount by the misalignment amount measurer 150 and the alignment operation by the stage driver 143 are executed under the control of the controller 9.

The controller 9 is, for example, a programmable logic controller. The controller 9 calculates pressure at the time of bringing the substrates W1 and W2 into pressure contact with each other and calculates a relative misalignment amount between the substrates W1 and W2, based on measurement signals input from the pressure sensor, the misalignment amount measurer 150, and the like. In addition, the controller 9 controls the operation of the stage driver 143 and the head driver 144, by outputting control signals to the stage driver 143 and the head driver 144, based on the calculated pressure or misalignment amount. Further, the controller 9, by outputting control signals to the substrate heaters 1411 and 1421, the high-frequency power source 216, the bias applier 217, the feeding valves 222A and 222B, and the transportation robots 821 and 841, controls the operation thereof.

Next, with respect to the substrate bonding system according to the present embodiment, a flow of operation from when the substrates W1 and W2 are input to the substrate bonding system to when the substrates W1 and W2 have been bonded to each other and are taken out from the substrate bonding system is described referring to FIGS. 4A to 9. The substrates W1 and W2 are first arranged on the feeding ports 811 and 812 illustrated in FIG. 4A, respectively. The substrates W1 and W2 are formed of one of, for example, a Si substrate, a glass substrate, an oxide substrate (for example, a silicon oxide ($SiO_2$) substrate or an alumina substrate ($Al_2O_3$)), and a nitride substrate (for example, silicon nitride (SiN) or aluminum nitride (AlN)). Note that at least one of the substrates W1 and W2 may be a substrate on the bonding surface of which a metal portion and an insulating film are exposed. Alternatively, at least one of the substrates W1 and W2 may be a substrate on the bonding surface of which an insulating film formed by depositing an oxide or a nitride is exposed. Herein, the description is made assuming that the substrate W1 is a glass substrate or an oxide substrate and the substrate W2 is a Si substrate or a nitride substrate. In addition, on the feeding port 811, for example, the substrate W2 to be held by the head 142 in the substrate bonding device 1 is arranged, and, on the feeding port 812, for example, the substrate W1 to be placed on the stage 141 in the substrate bonding device 1 is arranged. When the substrate W2 is arranged on the feeding port 811, the transportation robot 821 takes the substrate W2 out of the feeding port 811, as illustrated by an arrow AR11 in FIG. 4A. Then, the transportation robot 821, while holding the substrate W2, moves to a position in the first transportation device 82 at which the transportation robot 821 carries the substrate W2 into the load lock chamber 83, as illustrated by an arrow AR12 in FIG. 4A. Note that, when the substrate W1 is arranged on the feeding port 812, after taking out the substrate W1 from the feeding port 812, the transportation robot 821, while holding the substrate W1, moves to a position in the first transportation device 82 at which the transportation robot 821 carries the substrate W1 into the load lock chamber 83.

Figure 4A:
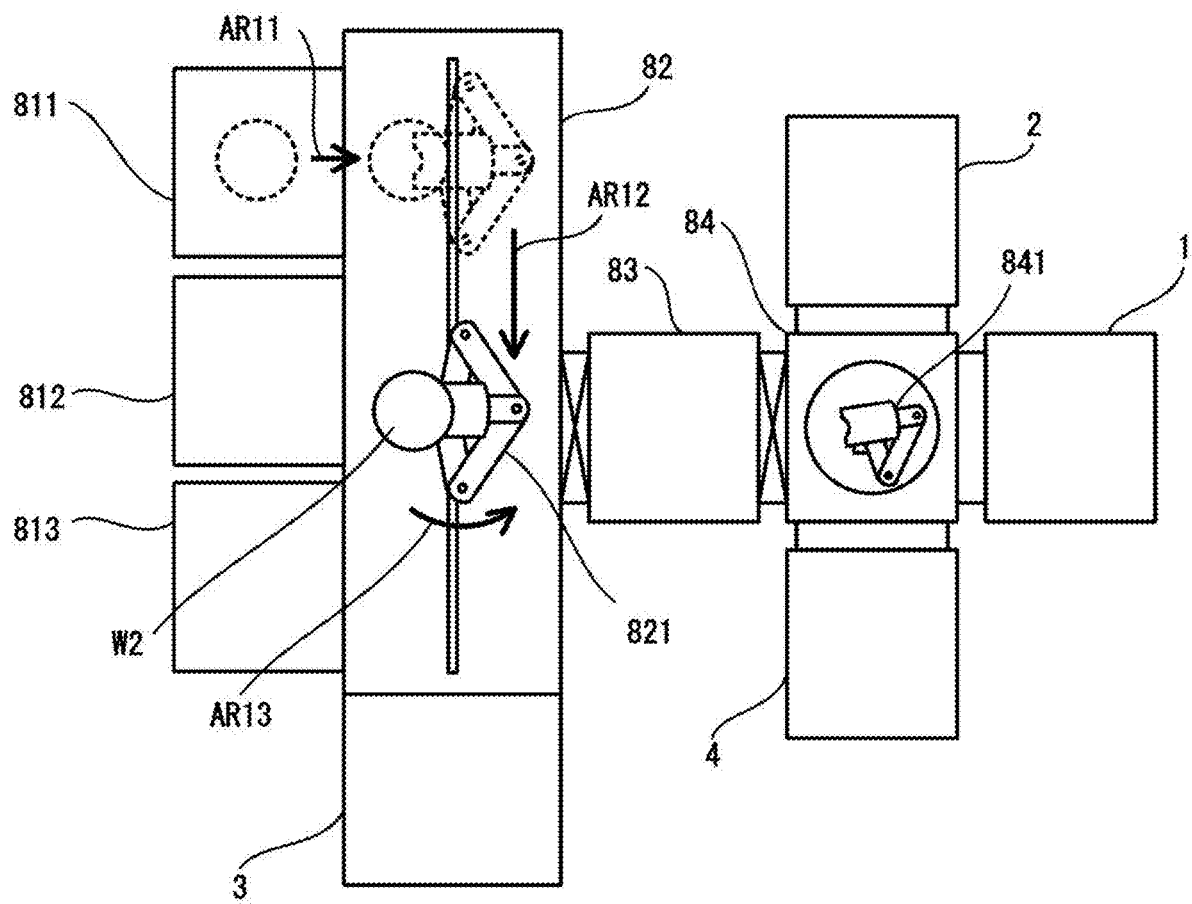
FIG. 4A is a diagram illustrating a manner in which a substrate is transported by a first transportation unit in the substrate bonding system according to the embodiment.
Figure 4B:
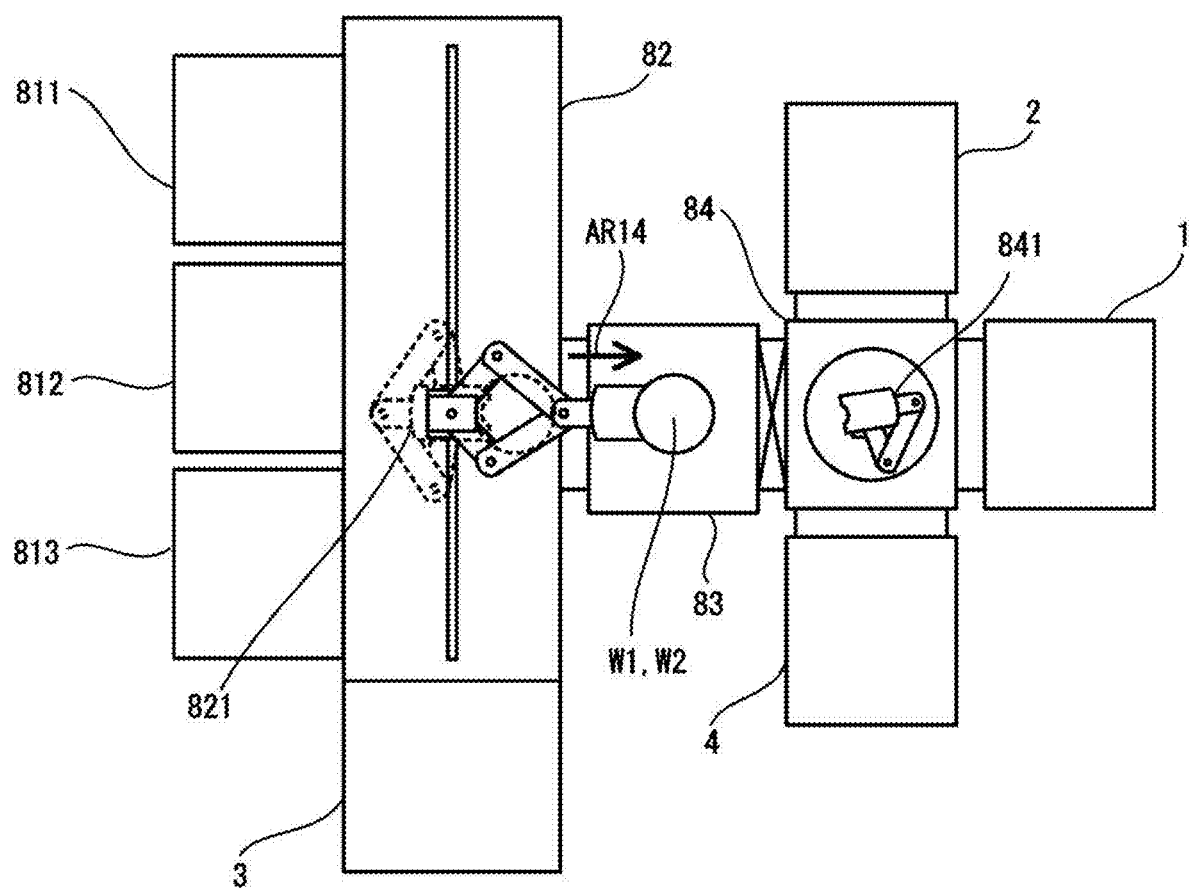
FIG. 4B is a diagram illustrating a manner in which the substrate is handed over from the first transportation unit to a load lock chamber in the substrate bonding system according to the embodiment.
Figure 5A:
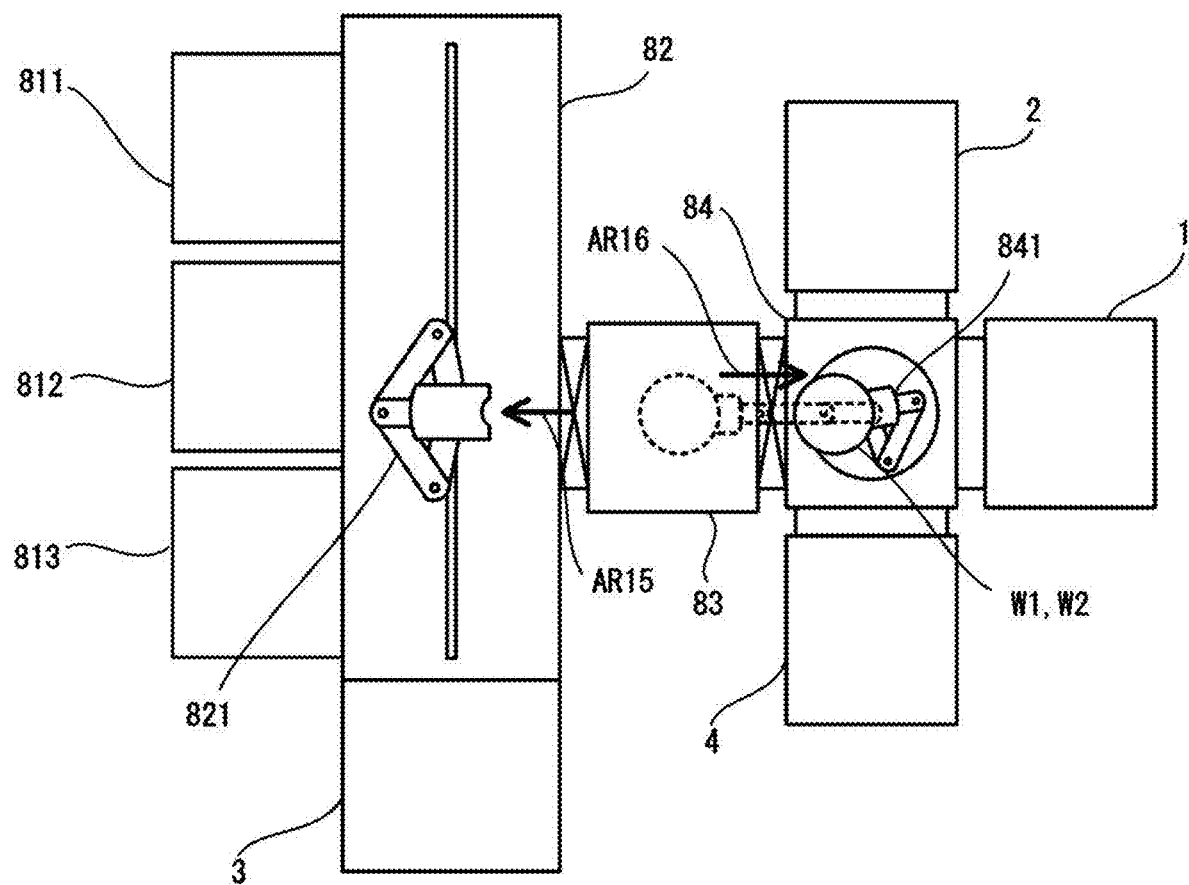
FIG. 5A is a diagram illustrating a manner in which the substrate is handed over from the load lock chamber to a second transportation unit in the substrate bonding system according to the embodiment.
Figure 5B:
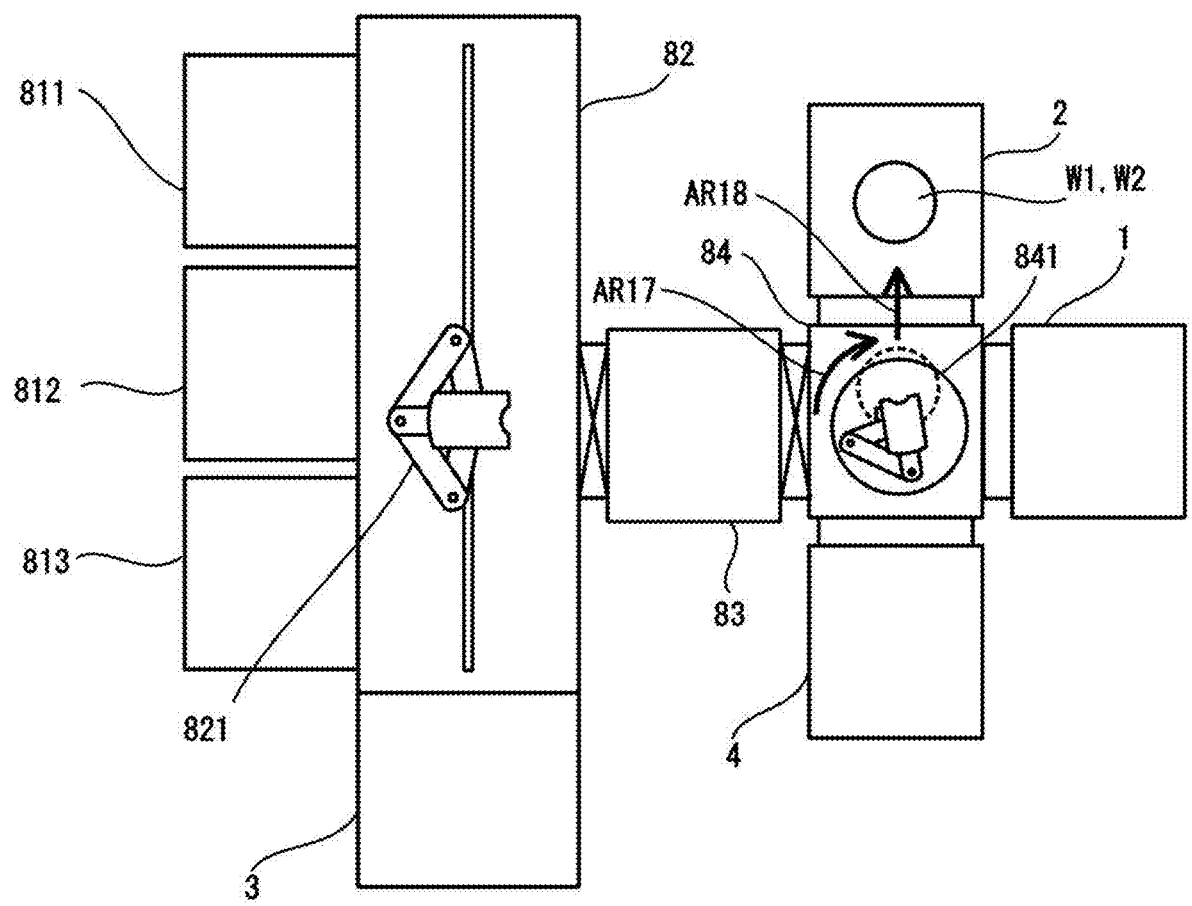
FIG. 5B is a diagram illustrating a manner in which the substrate is handed over from the second transportation unit to the activation treatment device in the substrate bonding system according to the embodiment.

Next, a door on the first transportation device 82 side of the load lock chamber 83 is opened and, at the same time, the transportation robot 821 turns in such a way that the tip portion of the arm points to the load lock chamber 83 side, as illustrated by an arrow AR13 in FIG. 4A. Succeedingly, the transportation robot 821, by stretching the arm, inserts the tip portion of the arm into the load lock chamber 83, as illustrated by an arrow AR14 in FIG. 4B. Then, the substrate W1 or W2 is transferred from the tip portion of the arm to the stage in the load lock chamber 83. Subsequently, when the transfer of the substrate W1 or W2 to the stage in the load lock chamber 83 is finished, the transportation robot 821 contracts the arm, as illustrated by an arrow AR15 in FIG. 5A. Then, the door on the first transportation device 82 side of the load lock chamber 83 is closed.

Succeedingly, after a door on the second transportation device 84 side of the load lock chamber 83 is opened, the transportation robot 841, while pointing the tip portion of the arm to the load lock chamber 83 side, stretches the arm. When, in the load lock chamber 83, the substrate W1 or W2 is transferred from the stage to the tip portion of the arm, the transportation robot 841, by contracting the arm, takes the substrate W1 or W2 out of the load lock chamber 83, as illustrated by an arrow AR16 in FIG. 5A. Subsequently, the door on the second transportation device 84 side of the load lock chamber 83 is closed. Next, the transportation robot 841 turns in such a way that the tip portion of the arm points to the activation treatment device 2 side, as illustrated by an arrow AR17 in FIG. 5B, and, at the same time, the activation treatment device 2 opens a carrying in/out port for the substrate W1 or W2. Succeedingly, the transportation robot 841, by stretching the arm, inserts the tip portion of the arm into the activation treatment device 2. Then, as illustrated by an arrow AR18 in FIG. 5B, the substrate W1 or W2 is transferred from the tip portion of the arm of the transportation robot 841 to the stage 210 (see FIG. 2) in the activation treatment device 2. Subsequently, after the transportation robot 841 contracts the arm, the activation treatment device 2 closes the carrying in/out port for the substrate W1 or W2.

Next, the activation treatment device 2, by subjecting at least one of the bonding surfaces to be bonded to each other of the respective ones of the substrates W1 and W2 to at least one of reactive ion etching using nitrogen gas and irradiation of nitrogen radicals, performs an activation treatment step of activating the bonding surface. Specifically, the activation treatment device 2 uses a different processing sequence depending on the type of substrate to be processed in the activation treatment of the bonding surface. When the activation treatment device 2 subjects the bonding surface of the substrate W1, that is, a glass substrate or an oxide substrate, to the activation treatment, the activation treatment device 2 first feeds $N_2$ gas into the chamber 212 from the nitrogen gas storage 221A through the feeding pipe 223A by opening the feeding valve 222A illustrated in FIG. 2. Next, the activation treatment device 2, while supply of high-frequency current from the high-frequency power source 216 to the induction coil 215 is stopped, applies high-frequency bias to the substrate W1 placed on the stage 210 by the bias applier 217. Through this processing, the bonding surface of the substrate W1 is subjected to reactive ion etching (RIE) using $N_2$ gas. Succeedingly, the activation treatment device 2 starts supply of the high-frequency current from the high-frequency power source 216 to the induction coil 215 and thereby generates plasma with the $N_2$ gas. On this occasion, the activation treatment device 2 stops application of the high-frequency bias to the substrate W1 by the bias applier 217. In this way, the bonding surface of the substrate W1 is irradiated with $N_2$ radicals.

On the other hand, when the activation treatment device 2 subjects the bonding surface of the substrate W2, that is, a Si substrate or a nitride substrate, to the activation treatment, the activation treatment device 2 first feeds $O_2$ gas into the chamber 212 from the oxygen gas storage 221B through the feeding pipe 223B by opening the feeding valve 222B. Next, the activation treatment device 2, while supply of high-frequency current from the high-frequency power source 216 to the induction coil 215 is stopped, applies a high-frequency bias to the substrate W2 placed on the stage 210 by the bias applier 217. Through this processing, the bonding surface of the substrate W2 is subjected to reactive ion etching (RIE) using $O_2$ gas. Succeedingly, the activation treatment device 2, by closing the feeding valve 222B and thereby stopping feeding of $O_2$ gas from the oxygen gas storage 221B into the chamber 212, exhausts the $O_2$ gas in the chamber 212. Subsequently, the activation treatment device 2 feeds $N_2$ gas into the chamber 212 from the nitrogen gas storage 221A through the feeding pipe 223A by opening the feeding valve 222A. Subsequently, the activation treatment device 2 starts supply of the high-frequency current from the high-frequency power source 216 to the induction coil 215 and thereby generates plasma with the $N_2$ gas. On this occasion, the activation treatment device 2 stops application of the high-frequency bias to the substrate W2 by the bias applier 217. In this way, the bonding surface of the substrate W2 is irradiated with $N_2$ radicals. When a sequence of activation treatment described above is finished, the activation treatment device 2 performs a gas exposure step of exposing the bonding surface of the substrate W1 or W2 to atmospheric air or water gas within a preset standard time. Then, the activation treatment device 2 opens the carrying in/out port for the substrate W1 or W2.

Subsequently, the transportation robot 841 stretches the arm and inserts the tip portion of the arm into the activation treatment device 2, and the substrate W1 or W2 is transferred from the stage 210 to the tip portion of the arm. Next, the transportation robot 841, by contracting the arm, takes the substrate W1 or W2 out of the activation treatment device 2, as illustrated by an arrow AR19 in FIG. 6A.

Figure 6A:
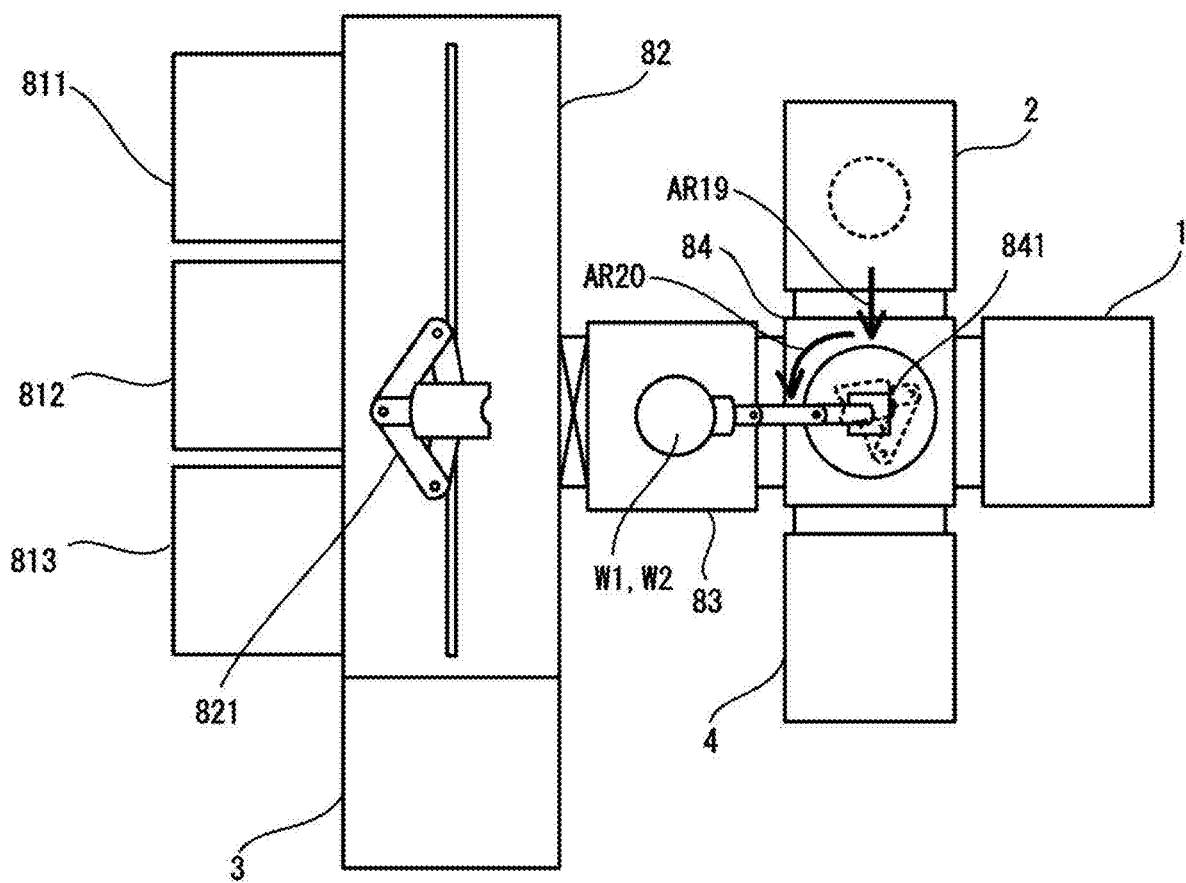
FIG. 6A is a diagram illustrating a manner in which the substrate is handed over from the second transportation unit to the load lock chamber in the substrate bonding system according to the embodiment.
Figure 6B:
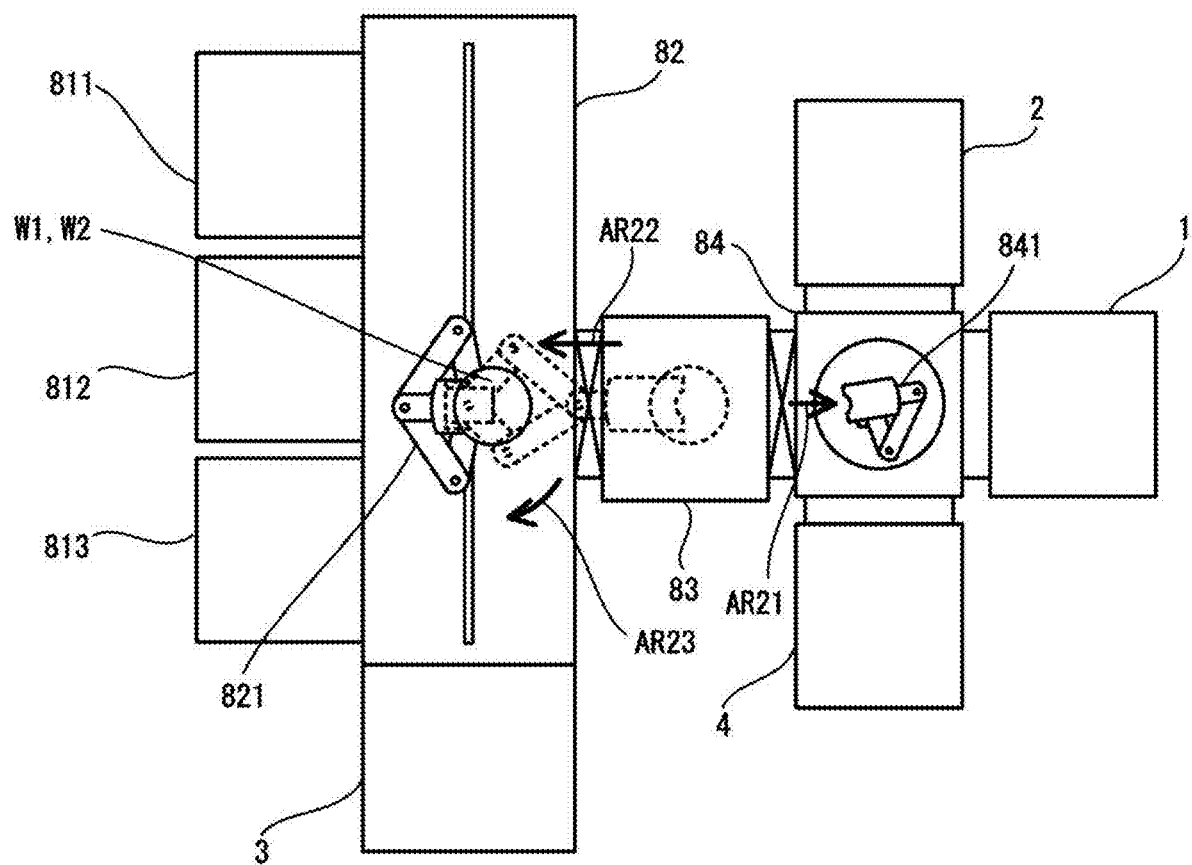
FIG. 6B is a diagram illustrating a manner in which the substrate is handed over from the load lock chamber to the first transportation unit in the substrate bonding system according to the embodiment.
Figure 7A:
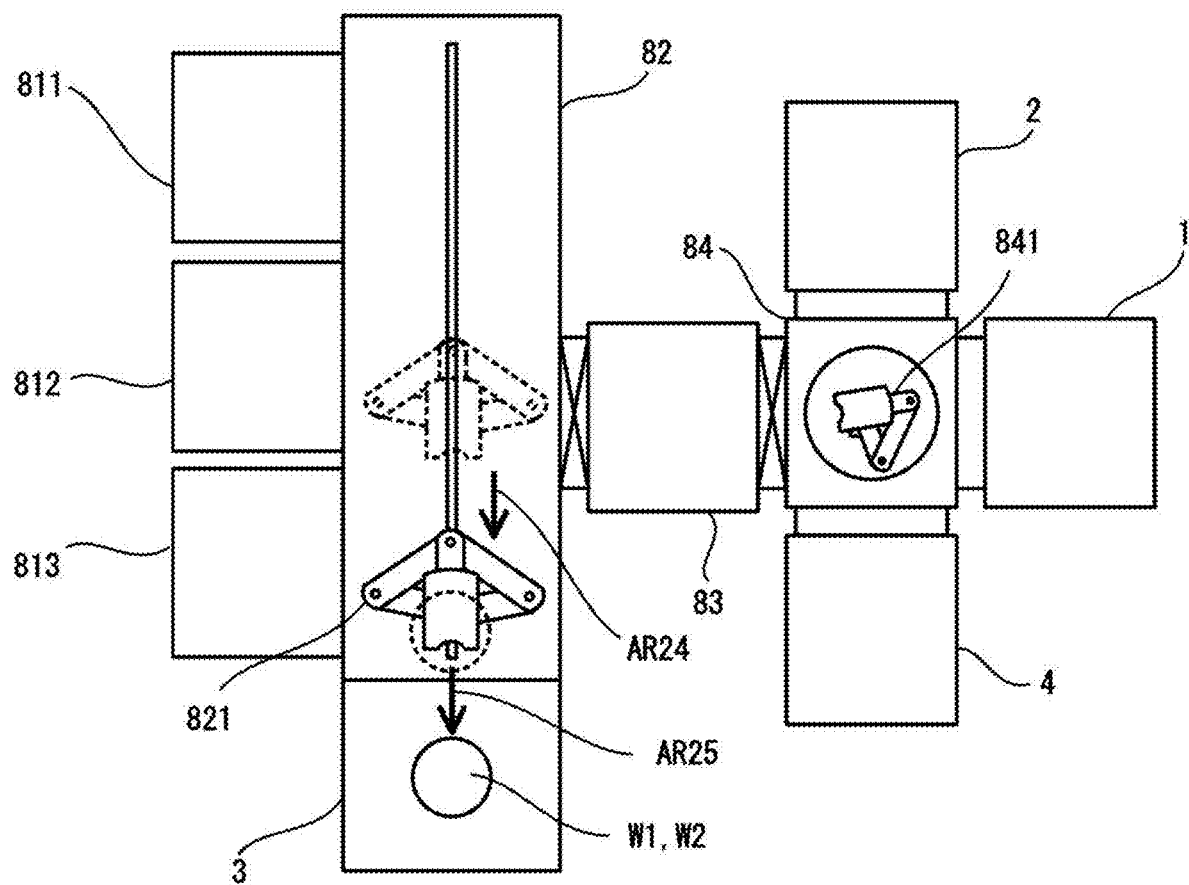
FIG. 7A is a diagram illustrating a manner in which the substrate is handed over from the first transportation unit to a cleaning device in the substrate bonding system according to the embodiment.
Figure 7B:
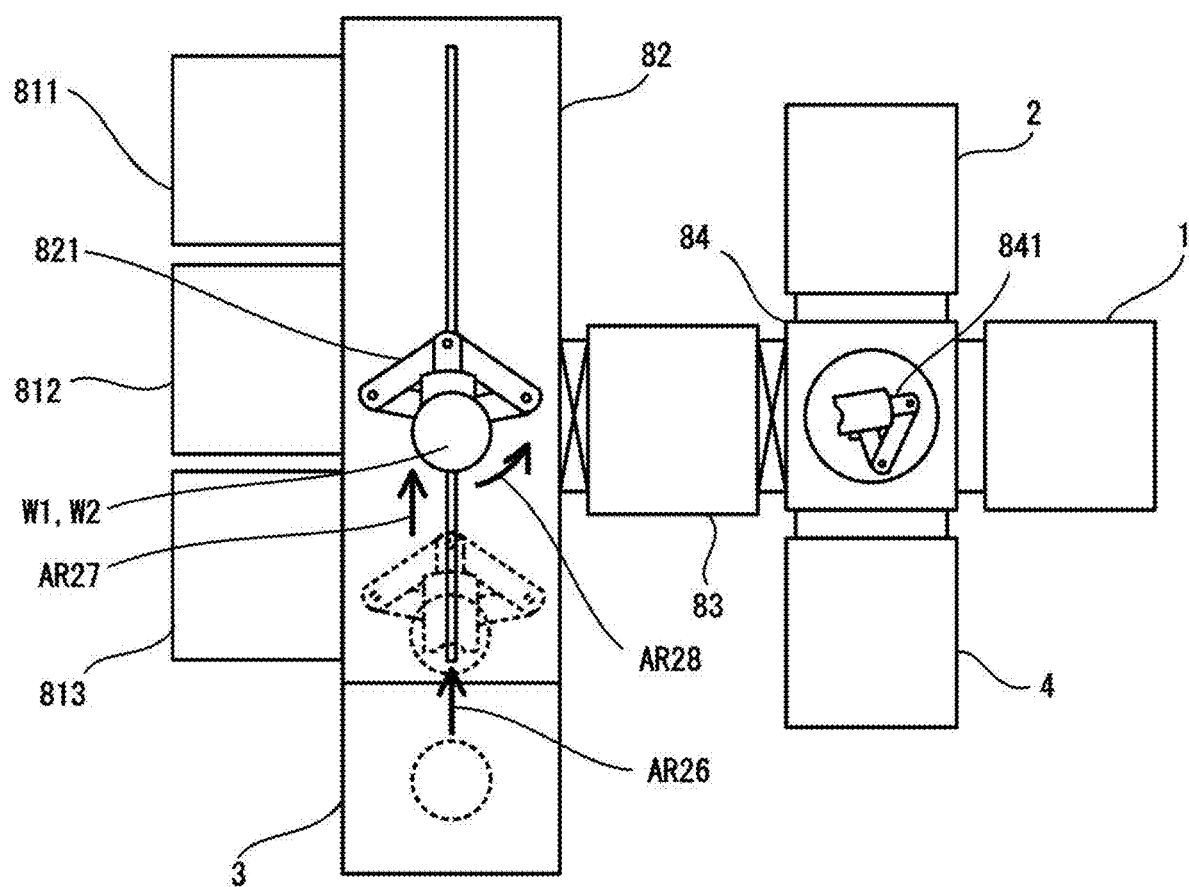
FIG. 7B is a diagram illustrating a manner in which the substrate is handed over from the cleaning device to the first transportation unit in the substrate bonding system according to the embodiment.

Succeedingly, when the transportation robot 841 turns in such a way that the tip portion of the arm points to the load lock chamber 83 side as illustrated by an arrow AR20 in FIG. 6A, the door on the second transportation device 84 side of the load lock chamber 83 is opened. Subsequently, the transportation robot 841 stretches the arm and inserts the tip portion of the arm into the load lock chamber 83, and the substrate W1 or W2 is transferred from the tip portion of the arm to the stage in the load lock chamber 83. Next, the transportation robot 841 contracts the arm as illustrated by an arrow AR21 in FIG. 6B, and, at the same time, the door on the second transportation device 84 side of the load lock chamber 83 is closed.

Succeedingly, after the door on the first transportation device 82 side of the load lock chamber 83 is opened, the transportation robot 821, while pointing the tip portion of the arm to the load lock chamber 83 side, stretches the arm and inserts the tip portion of the arm into the load lock chamber 83. Then, the substrate W1 or W2 is transferred from the stage in the load lock chamber 83 to the tip portion of the arm of the transportation robot 821. Subsequently, after the transportation robot 821, by contracting the arm, takes the substrate W1 or W2 out of the load lock chamber 83 as illustrated by an arrow AR22 in FIG. 6B, the door on the first transportation device 82 side of the load lock chamber 83 is closed. Next, the transportation robot 821 turns in such a way that the tip portion of the arm points to the cleaning device 3 side, as illustrated by an arrow AR23 in FIG. 6B. Succeedingly, the transportation robot 821, while holding the substrate W1 or W2, moves to a position in the first transportation device 82 at which the transportation robot 821 carries the substrate W1 or W2 into the cleaning device 3, as illustrated by an arrow AR24 in FIG. 7A. Subsequently, when the cleaning device 3 opens a carrying in/out port for the substrate W1 or W2, the transportation robot 821, by stretching the arm, inserts the tip portion of the arm into the cleaning device 3. Then, as illustrated by an arrow AR25 in FIG. 7A, the substrate W1 or W2 is transferred from the tip portion of the arm of the transportation robot 821 to the stage in the cleaning device 3.

Next, the cleaning device 3, while spraying water to which ultrasonic waves are applied on the bonding surface of the substrate W1 or W2 from the cleaning head, causes the stage on which the substrate W1 or W2 is placed to scan in XY directions and cleans the entire bonding surface of the substrate W1 or W2. Through this processing, foreign objects having adhered to the bonding surface of the substrate W1 or W2 are removed. Succeedingly, the cleaning device 3 stops the discharge of water by the cleaning head and subsequently, by spin-drying the substrate by rotating the stage, finishes the cleaning treatment. Subsequently, when a sequence of cleaning processing described above is finished, the cleaning device 3 opens the carrying in/out port for the substrate W1 or W2.

Subsequently, the transportation robot 821 stretches the arm and inserts the tip portion of the arm into the cleaning device 3, and the substrate W1 or W2 is transferred from the stage to the tip portion of the arm. Next, the transportation robot 821, by contracting the arm, takes the substrate W1 or W2 out of the cleaning device 3, as illustrated by an arrow AR26 in FIG. 7B. Succeedingly, the transportation robot 821, while holding the substrate W1 or W2, moves to the position in the first transportation device 82 at which the transportation robot 821 carries the substrate W1 or W2 into the load lock chamber 83, as illustrated by an arrow AR27 in FIG. 7B. Subsequently, the door on the first transportation device 82 side of the load lock chamber 83 is opened and, at the same time, the transportation robot 821 turns in such a way that the tip portion of the arm points to the load lock chamber 83 side, as illustrated by an arrow AR28 in FIG. 7B.

Figure 8A:
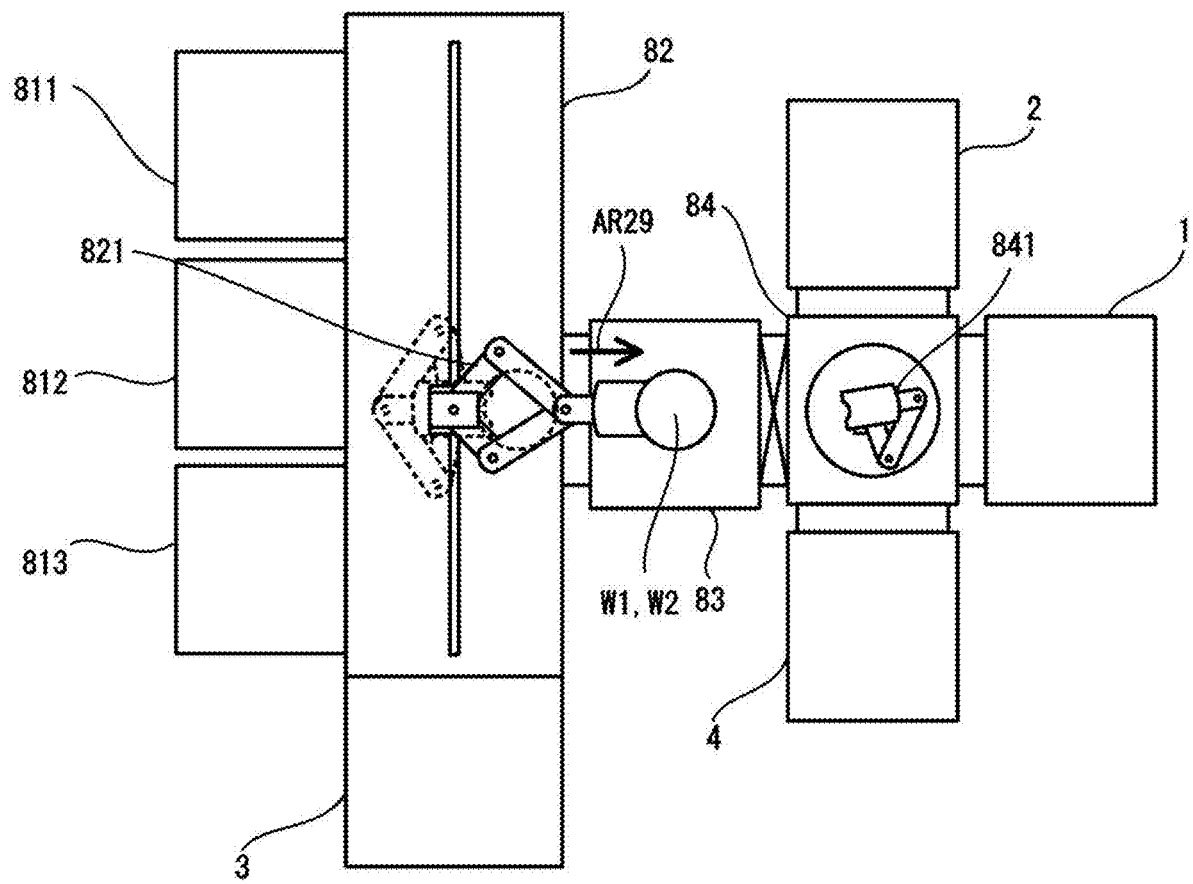
FIG. 8A is a diagram illustrating a manner in which the substrate is handed over from the first transportation unit to the load lock chamber in the substrate bonding system according to the embodiment.
Figure 8B:
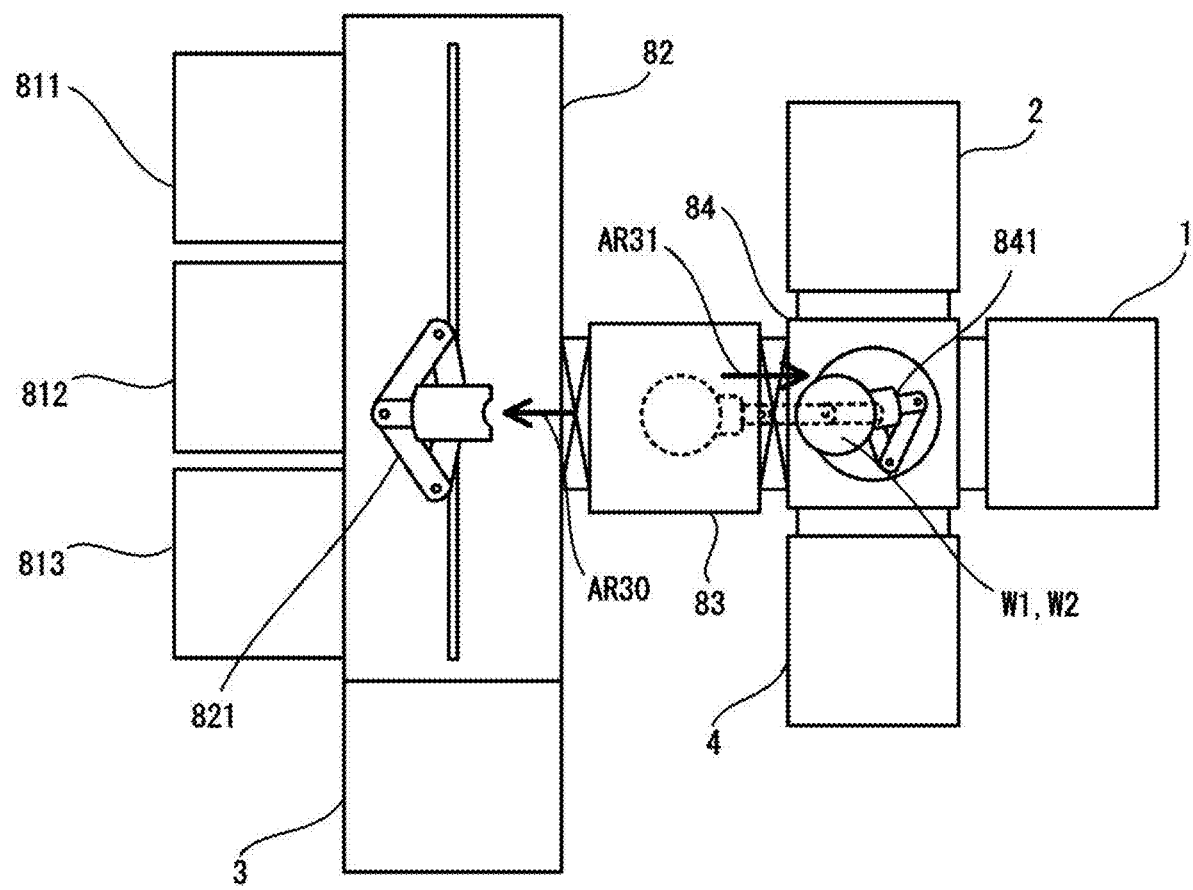
FIG. 8B is a diagram illustrating a manner in which the substrate is handed over from the load lock chamber to the second transportation unit in the substrate bonding system according to the embodiment.

Next, the transportation robot 821, by stretching the arm, inserts the tip portion of the arm into the load lock chamber 83, as illustrated by an arrow AR29 in FIG. 8A. Then, the substrate W1 or W2 is transferred from the tip portion of the arm to the stage in the load lock chamber 83. Succeedingly, when the transfer of the substrate W1 or W2 to the stage in the load lock chamber 83 is finished, the transportation robot 821 contracts the arm, as illustrated by an arrow AR30 in FIG. 8B. Then, the door on the first transportation device 82 side of the load lock chamber 83 is closed.

Subsequently, after the door on the second transportation device 84 side of the load lock chamber 83 is opened, the transportation robot 841, while pointing the tip portion of the arm to the load lock chamber 83 side, stretches the arm. When, in the load lock chamber 83, the substrate W1 or W2 is transferred from the stage to the tip portion of the arm, the transportation robot 841, by contracting the arm, takes the substrate W1 or W2 out of the load lock chamber 83, as illustrated by an arrow AR31 in FIG. 8B. Then, the door on the second transportation device 84 side of the load lock chamber 83 is closed. On this occasion, in the case where the transportation robot 841 takes out of the load lock chamber 83 the substrate W2 that is to be supported by the head 142 in the substrate bonding device 1, the transportation robot 841 turns in such a way that the tip portion of the arm points to the turnover device 4 side, as illustrated by an arrow AR32 in FIG. 9A. Succeedingly, the transportation robot 841, by stretching the arm, inserts the tip portion of the arm into the turnover device 4. Then, as illustrated by an arrow AR33 in FIG. 9A, the substrate W2 is transferred from the tip portion of the arm of the transportation robot 841 to the substrate holder in the turnover device 4. Subsequently, the transportation robot 841 contracts the arm. Next, the turnover device 4, by turning over the substrate holder, holds the substrate W2 in such an attitude that the bonding surface of the substrate W2 faces vertically downward. Succeedingly, the transportation robot 841, by stretching the arm, inserts the tip portion of the arm into the turnover device 4 and, while holding the opposite side to the bonding surface side of the substrate W2, takes the substrate W2 out of the turnover device 4. Subsequently, the transportation robot 841 turns in such a way that the tip portion of the arm points to the substrate bonding device 1 side, as illustrated by an arrow AR34 in FIG. 9B. In addition, in the case where the transportation robot 841 takes out of the load lock chamber 83 the substrate W1 that is to be placed on the stage 141 in the substrate bonding device 1, the transportation robot 841 directly turns in such a way that the tip portion of the arm points to the substrate bonding device 1 side.

Next, when the substrate bonding device 1 opens a carrying in/out port for the substrate W1 or W2, the transportation robot 841, by stretching the arm, inserts the tip portion of the arm into the substrate bonding device 1. Then, as illustrated by an arrow AR35 in FIG. 9B, the substrate W2 is transferred from the tip portion of the arm of the transportation robot 841 to the head 142 (see FIG. 3) in the substrate bonding device 1, or the substrate W1 is transferred from the tip portion of the arm of the transportation robot 841 to the stage 141 (see FIG. 3) in the substrate bonding device 1. Succeedingly, when the transportation robot 841 contracts the arm, the substrate bonding device 1 closes the carrying in/out port for the substrate W1 or W2. Subsequently, the substrate bonding device 1, by putting the exhaust valve 123B into the closed state, reduces air pressure in the chamber 120. Note that, as described afore, a step in which the substrate W1 or W2 is transported through the first transportation device 82, the second transportation device 84, and the load lock chamber 83 is equivalent to a transportation step.

Next, the substrate bonding device 1 performs a bonding step of bonding two substrates having the bonding surfaces having been subjected to the activation treatment in the activation treatment step to each other. In this step, when the substrates W1 and W2 are supported by the stage 141 and the head 142, respectively, the substrate bonding device 1 moves the substrate W2 in a direction in which, from a state in which the substrates W1 and W2 are separated from each other, the substrates W1 and W2 come close to each other and brings the bonding surfaces of the substrates W1 and W2 into contact with each other. In this processing, the substrate bonding device 1 first brings the head 142 supporting the substrate W2 close to the stage 141 supporting the substrate W1 and thereby causes both substrates W1 and W2 to come close to each other. Next, while both substrates W1 and W2 are in proximity to each other, the substrate bonding device 1 executes alignment operation of both substrates W1 and W2, based on a misalignment amount measured by the misalignment amount measurer 150.

Succeedingly, the substrate bonding device 1, by bringing the head 142 close to the stage 141 again, causes the two substrates W1 and W2 to come into contact with each other. Subsequently, the substrate bonding device 1, while keeping the bonding surfaces of the substrates W1 and W2 in contact with each other, bonds the two substrates W1 and W2 to each other by applying pressure in a direction in which the two substrates W1 and W2 adhere to each other. On this occasion, the bonding surfaces of the substrates W1 and W2 are covered by OH groups or water molecules. Because of this condition, bringing the bonding surfaces of the substrates W1 and W2 into contact with each other causes the substrates W1 and W2 to be temporarily bonded to each other by hydrogen bonds between OH groups or water molecules. Next, the substrate bonding device 1 maintains the substrates W1 and W2 in a heated state at, for example, 120 to 200° C. by the substrate heaters 1411 and 1421, respectively, for 2 to 7 hours. It is considered that, through this heating, many of water molecules and hydrogen generated at the time when hydrogen bonds between OH groups existing on the bonding surfaces of the substrates W1 and W2 are converted to covalent bonds or water molecules and hydrogen remaining on the bonding surfaces of the substrates W1 and W2 even in a vacuum get out of a bonding interface between the substrates W1 and W2 to the outside and strong covalent bonds are formed between the bonding surfaces. It is also considered that, on this occasion, in a process in which water molecules and hydrogen get out of the bonding interface between the temporarily-bonded substrates W1 and W2, the bonding surfaces of the substrates W1 and W2 come into contact with each other even in a portion that was not in contact at the time of temporary bonding, that is, the bonding interface extends in effect, and, as a result, bonding area increases. When the substrate bonding device 1 has bonded the substrates W1 and W2 to each other, the substrate bonding device 1, by putting the exhaust valve 123B into the closed state and the air feeding valve into the open state and thereby feeding air into the chamber 120, brings air pressure in the chamber 120 to an atmospheric pressure. Then, the substrate bonding device 1 opens the carrying in/out port for the substrates W1 and W2.

Figure 9A:
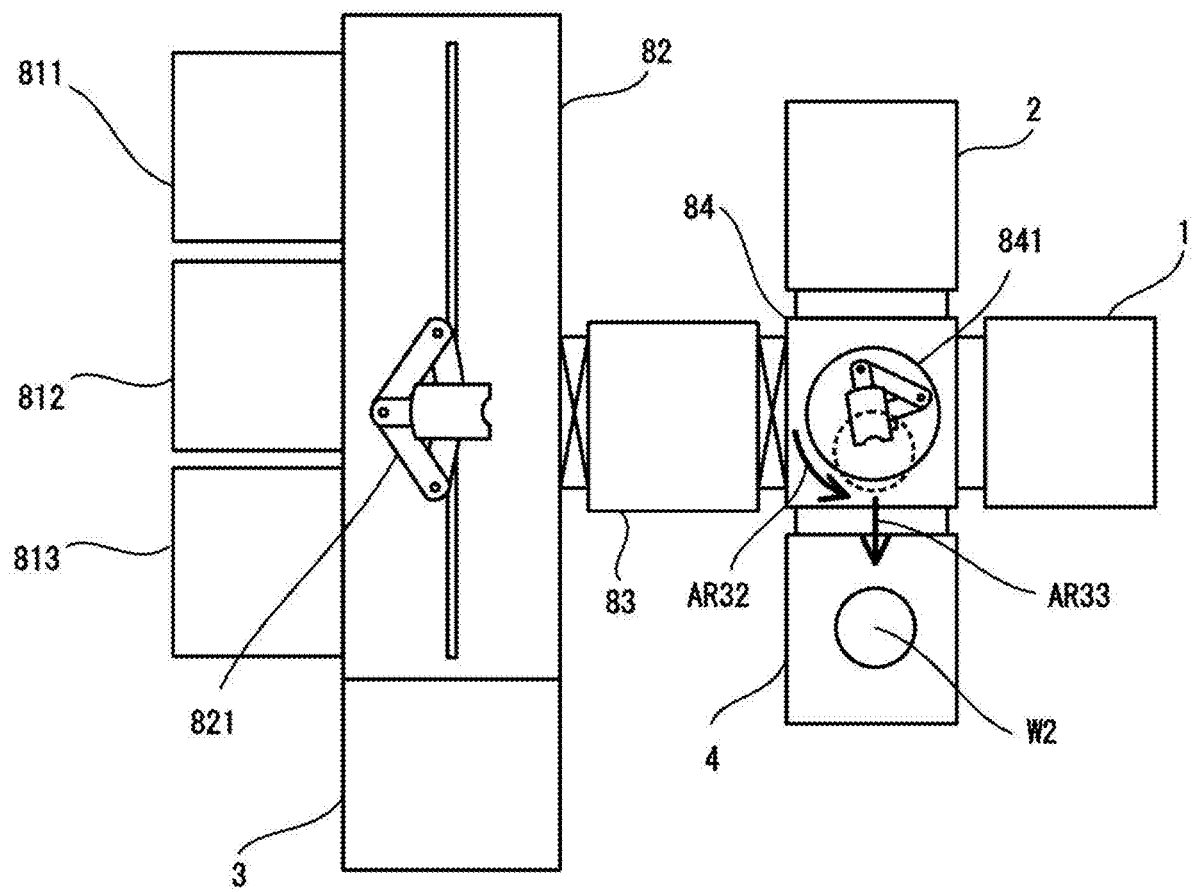
FIG. 9A is a diagram illustrating a manner in which the substrate is handed over from the second transportation unit to a turnover device in the substrate bonding system according to the embodiment.
Figure 9B:
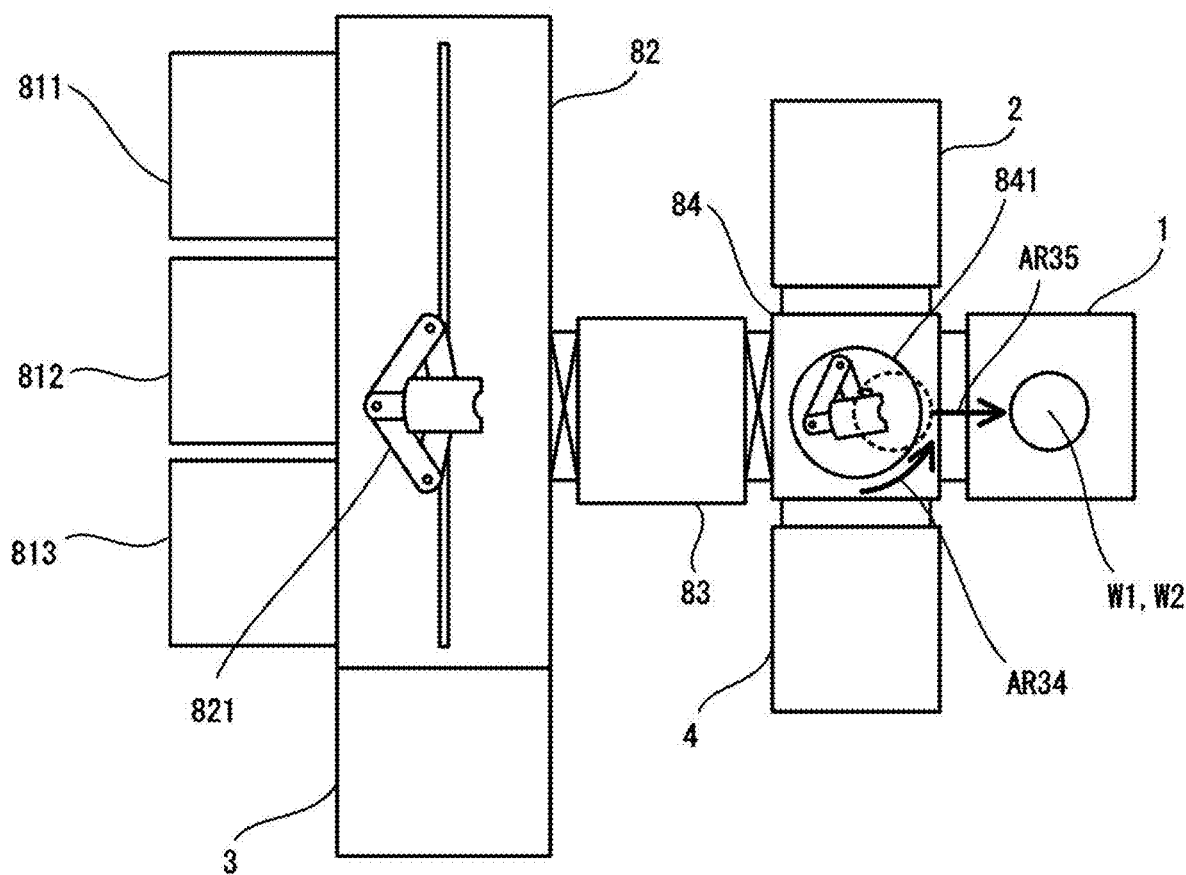
FIG. 9B is a diagram illustrating a manner in which the substrate is transported by the second transportation unit to the bonding device in the substrate bonding system according to the embodiment.

Subsequently, the transportation robot 841 illustrated in FIG. 9B, by stretching the arm, inserts the tip portion of the arm into the substrate bonding device 1. Then, the substrates W1 and W2 that are bonded to each other are transferred from the stage 141 or the head 142 in the substrate bonding device 1 to the tip portion of the arm of the transportation robot 841. Next, the transportation robot 841, by contracting the arm, takes the substrates W1 and W2 bonded to each other out of the substrate bonding device 1. Then, the substrate bonding device 1 closes the carrying in/out port for the substrates W1 and W2 again. Succeedingly, the transportation robot 841 turns in such a way that the tip portion of the arm points to the load lock chamber 83 side. Subsequently, when the door on the second transportation device 84 side of the load lock chamber 83 is opened, the transportation robot 841, while pointing the tip portion of the arm to the load lock chamber 83 side, stretches the arm. When, in the load lock chamber 83, the substrates W1 and W2 bonded to each other are transferred from the tip portion of the arm to the stage, the transportation robot 841 contracts the arm. Then, the door on the second transportation device 84 side of the load lock chamber 83 is closed.

Next, after the door on the first transportation device 82 side of the load lock chamber 83 is opened, the transportation robot 821, while pointing the tip portion of the arm to the load lock chamber 83 side, stretches the arm and inserts the tip portion of the arm into the load lock chamber 83. Then, the substrates W1 and W2 bonded to each other are transferred from the stage in the load lock chamber 83 to the tip portion of the arm of the transportation robot 821. Subsequently, after the transportation robot 821, by contracting the arm, takes the substrates W1 and W2 bonded to each other out of the load lock chamber 83, the door on the first transportation device 82 side of the load lock chamber 83 is closed. Succeedingly, the transportation robot 821 turns in such a way that the tip portion of the arm points to the opposite side to the load lock chamber 83 side. Subsequently, the transportation robot 821, while holding the substrates W1 and W2 bonded to each other, moves to a position in the first transportation device 82 at which the transportation robot 821 carries the substrates W1 and W2 bonded to each other into the take-out port 813. Next, the transportation robot 821, by stretching the arm, inserts the tip portion of the arm into the take-out port 813 and arranges the substrates W1 and W2 bonded to each other in the take-out port 813.

Next, a result of evaluation of bonding strength with respect to 22 types of samples that were produced by bonding two substrates W1 and W2 to each other by the substrate bonding system according to the present embodiment is described. With respect to Samples 1 to 14, in the RIE treatment using $N_2$ gas on the substrate W1 that is a $SiO_2$ substrate in the activation treatment device 2, the flow rate of the $N_2$ gas fed into the chamber 212 was set to 50 sccm, the bias power of a high-frequency bias applied to the substrate W1 was set to 100 W, and treatment time was set to 30 sec. In addition, in the RIE treatment using $O_2$ gas on the substrate W2 that is a Si substrate in the activation treatment device 2, the flow rate of the $O_2$ gas fed into the chamber 212 was set to 50 sccm, the bias power of a high-frequency bias applied to the substrate W2 was set to 110 W, and treatment time was set to 30 sec. Further, in the $N_2$ radical treatment on the substrates W1 and W2, the flow rate of $N_2$ gas fed into the chamber 212 was set to 200 sccm, power supplied to the induction coil 215 was set to 2500 W, and treatment time was set to 15 sec. In addition, with respect to Samples 1 to 22, all of gas pressures in the first transportation device 82, the load lock chamber 83, and the second transportation device 84 at the time when the substrate W1 or W2 is transported from the cleaning device 3 to the substrate bonding device 1 were set to 1000 Pa. Further, with respect to Samples 1 to 20, the bonding processing of the substrates W1 and W2 in the substrate bonding device 1 for any samples was performed by, while gas pressure in the chamber 120 is set to 1000 Pa, temporarily bonding the substrates W1 and W2 to each other by applying a pressure of 1000 N and subsequently performing heat treatment under the conditions of a treatment temperature of 150° C. and a treatment time of 7 hours. Table 1 below shows a list including an exposure medium to which the bonding surfaces of the substrates W1 and W2 were exposed and a location at which the substrates W1 and W2 were first exposed to the exposure medium after the activation treatment was finished for each of Samples 1 to 4 among 20 types of samples. In Samples 1 to 4, a $SiO_2$ substrate and a Si substrate were used as the substrate W1 and the substrate W2, respectively. In this evaluation, as the $SiO_2$ substrate, a thermal oxide film substrate in which a $SiO_2$ film is formed on a surface of a Si substrate was employed. Note that, in the column "Exposure medium" in Table 1, "Water gas" indicates that the bonding surfaces of the substrates W1 and W2 were exposed to water gas, and "Atmospheric air" indicates that the bonding surfaces of the substrates W1 and W2 were exposed to atmospheric air. In addition, in the column "Exposure location after activation treatment" in Table 1, "Activation treatment device" indicates that, after the activation treatment in the activation treatment device 2 was finished, the bonding surface of the substrate W1 or W2 was exposed to an exposure medium in the activation treatment device 2 without moving therefrom, and "Second transportation device" indicates that, after the activation treatment in the activation treatment device 2 was finished, the transportation robot 841 took the substrate W1 or W2 out of the activation treatment device 2 to the second transportation device 84 and the substrate W1 or W2 was exposed to an exposure medium in the second transportation device 84. In addition, "Load lock chamber" indicates that, after the activation treatment in the activation treatment device 2 was finished, the transportation robot 841 took the substrate W1 or W2 out of the activation treatment device 2 and subsequently carried the substrate W1 or W2 into the load lock chamber 83, and the substrate W1 or W2 was exposed to an exposure medium in the load lock chamber 83. In addition, for all Samples 1 to 4, in the activation treatment device 2, the substrate W1, after having been subjected to the RIE treatment using $N_2$ gas, was subjected to the $N_2$ radical treatment, and the substrate W2, after having been subjected to the RIE treatment using $O_2$ gas, was subjected to the $N_2$ radical treatment.

TABLE 1

| | Exposure medium | Exposure location after activation treatment |
|---|---|---|
| Sample 1 | Water gas | Activation treatment device |
| Sample 2 | Atmospheric air | Activation treatment device |
| Sample 3 | Atmospheric air | Second transportation device |
| Sample 4 | Atmospheric air | Load lock chamber |

In addition, Table 2 below shows a list including a time from when the activation treatment on the substrate W1 or W2 was finished until when the substrate W1 or W2 was exposed to atmospheric air for each of Samples 5 to 7 among the 20 types of samples. Note that, for all Samples 5 to 7, in the activation treatment device 2, the substrate W1, after having been subjected to the RIE treatment using $N_2$ gas, was subjected to the $N_2$ radical treatment, and the substrate W2, after having been subjected to the RIE treatment using $O_2$ gas, was subjected to the $N_2$ radical treatment.

TABLE 2

| | Time to atmospheric air exposure after activation treatment [min] |
|---|---|
| Sample 5 | 1 |
| Sample 6 | 5 |
| Sample 7 | 10 |

Further, Table 3 below shows a list including details of the activation treatment on the substrates W1 and W2 and a time from when the activation treatment was finished until when the substrate W1 or W2 was exposed to atmospheric air for each of Samples 2 and 8 to 10 among the 20 types of samples. Note that "Substrate W1" and "Substrate W2" in Table 3 indicate details of the activation treatment on the substrate W1 and details of the activation treatment on the substrate W2, respectively. In addition, in the columns "$N_2$ RIE treatment", "$N_2$ radical treatment", and "$O_2$ RIE treatment", "Done" indicates that the treatment was performed, and "Not done" indicates that the treatment was omitted. In this evaluation, "$N_2$ RIE treatment" and "$O_2$ RIE treatment" indicate the RIE treatment using $N_2$ gas and the RIE treatment using $O_2$ gas, respectively.

TABLE 3

| | Substrate W1 | | | Substrate W2 | | Time to atmospheric air exposure after activation treatment [min] |
|---|---|---|---|---|---|---|
| | $O_2$ RIE treatment | $N_2$ RIE treatment | $N_2$ radical treatment | $O_2$ RIE treatment | $N_2$ radical treatment | |
| Sample 2 | Not done | Done | Done | Done | Done | 0 |
| Sample 8 | Not done | Done | Not done | Done | Not done | 0 |
| Sample 9 | Done | Not done | Not done | Done | Not done | 0 |
| Sample 10 | Done | Not done | Not done | Done | Not done | 10 |

In addition, Table 4 below shows a list including a gas pressure condition in the second transportation device 84, the load lock chamber 83, and the first transportation device 82 at the time when the substrate W1 or W2 was transported from the activation treatment device 2 to the cleaning device 3 for each of Samples 2 and 11 to 14 among the 20 types of samples.

TABLE 4

| | Gas pressure during transportation [Pa] |
|---|---|
| Sample 11 | 10000 |
| Sample 2 | 1000 |
| Sample 12 | 100 |
| Sample 13 | 10 |
| Sample 14 | 1 |

Further, Table 5 below shows a list including details of the activation treatment on the substrates W1 and W2 for each of Samples 15 to 18 among the 20 types of samples. Note that, in Samples 15 to 18, both substrates W1 and W2 are glass substrates. In addition, "$N_2$ RIE treatment", "$N_2$ radical treatment", and "$O_2$ RIE treatment" in Table 5 are the same as those in Table 3. In this evaluation, in the RIE treatment using $N_2$ gas, the flow rate of the $N_2$ gas fed into the chamber 212 was set to 50 sccm, the bias power of a high-frequency bias applied to the substrate W1 was set to 250 W, and treatment time was set to 60 sec. In the RIE treatment using $O_2$ gas, the flow rate of the $O_2$ gas fed into the chamber 212 was set to 50 sccm, the bias power of a high-frequency bias applied to the substrates W1 and W2 was set to 250 W, and treatment time was set to 60 sec. Further, in $N_2$ radical treatment on the substrates W1 and W2, a configuration including flat plate electrodes arranged outside the plasma chamber 213 and a high-frequency power source connected to the flat plate electrodes was used, and the flow rate of $N_2$ gas fed into the plasma 213 was set to 200 sccm, power supplied between the flat plate electrodes was set to 250 W at 27 MHz, and treatment time was set to 15 sec.

TABLE 5

| | $O_2$ RIE treatment | $N_2$ RIE treatment | $N_2$ radical treatment |
|---|---|---|---|
| Sample 15 | Done | Not done | Not done |
| Sample 16 | Done | Done | Done |
| Sample 17 | Done | Not done | Done |
| Sample 18 | Not done | Done | Done |

In addition, Table 6 below shows a list including details of the activation treatment on the substrates W1 and W2 for each of Samples 19 and 20 among the 20 types of samples. In addition, with respect to Sample 19, the substrates W1 and W2 were exposed to water gas after the activation treatment. Note that, in Samples 19 and both substrates W1 and W2 are substrates in each of which, on a Si substrate, an insulating film formed by depositing $SiO_2$ is formed. In this evaluation, in the RIE treatment using $N_2$ gas, the flow rate of the $N_2$ gas fed into the chamber 212 was set to 50 sccm, the bias power of a high-frequency bias applied to the substrate W1 was set to 500 W, and treatment time was set to 60 sec. In the RIE treatment using $O_2$ gas, the flow rate of the $O_2$ gas fed into the chamber 212 was set to 50 sccm, the bias power of a high-frequency bias applied to the substrates W1 and W2 was set to 500 W, and treatment time was set to 60 sec. Note that other conditions, such as the condition of the $N_2$ radical treatment on the substrates W1 and W2, were the same as those for Samples 1 to 14. In addition, for Sample 19, gas pressure at the time of bonding was set to 1000 Pa, and, for Sample 20, gas pressure at the time of bonding was set to the atmospheric pressure and treatment temperature and treatment time in the heat treatment were set to 350° C. and 7 hours, respectively.

TABLE 6

|  | O$_2$ RIE treatment | N$_2$ RIE treatment | N$_2$ radical treatment |
|---|---|---|---|
| Sample 19 | Done | Done | Done |
| Sample 20 | Done | Not done | Not done |

Further, Table 7 below shows a list including details of the activation treatment on the substrates W1 and W2 for each of Samples 21 and 22 among the 22 types of samples. Note that, in Samples 21 and 22, both substrates W1 and W2 are glass substrates the bonding surfaces of which have a surface roughness of 0.49 nm in RMS. In addition, "N$_2$ RIE treatment", "N$_2$ radical treatment", and "O$_2$ RIE treatment" in Table 7 are the same as those in Table 3. In this evaluation, in the RIE treatment using N$_2$ gas, the flow rate of the N$_2$ gas fed into the chamber 212 was set to 50 sccm, the bias power of a high-frequency bias applied to the substrate W1 was set to 250 W, and treatment time was set to 120 sec. In the RIE treatment using O$_2$ gas, the flow rate of the O$_2$ gas fed into the chamber 212 was set to 50 sccm, the bias power of a high-frequency bias applied to the substrates W1 and W2 was set to 250 W, and treatment time was set to 120 sec. Further, in N$_2$ radical treatment on the substrates W1 and W2, a configuration including flat plate electrodes arranged outside the plasma chamber 213 and a high-frequency power source connected to the flat plate electrodes was used, and the flow rate of N$_2$ gas fed into the plasma 213 was set to 200 sccm, power supplied between the flat plate electrodes was set to 250 W at 27 MHz, and treatment time was set to 15 sec. In addition, the bonding processing of the substrates W1 and W2 in the substrate bonding device 1 for any samples was performed by, while gas pressure in the chamber 120 is set to 1000 Pa, temporarily bonding the substrates W1 and W2 to each other by applying a pressure of 1000 N and subsequently performing heat treatment under the conditions of a treatment temperature of 200° C. and a treatment time of 2 hours.

TABLE 7

|  | O$_2$ RIE treatment | N$_2$ RIE treatment | N$_2$ radical treatment |
|---|---|---|---|
| Sample 21 | Done | Not done | Not done |
| Sample 22 | Done | Done | Done |

Figure 10A:
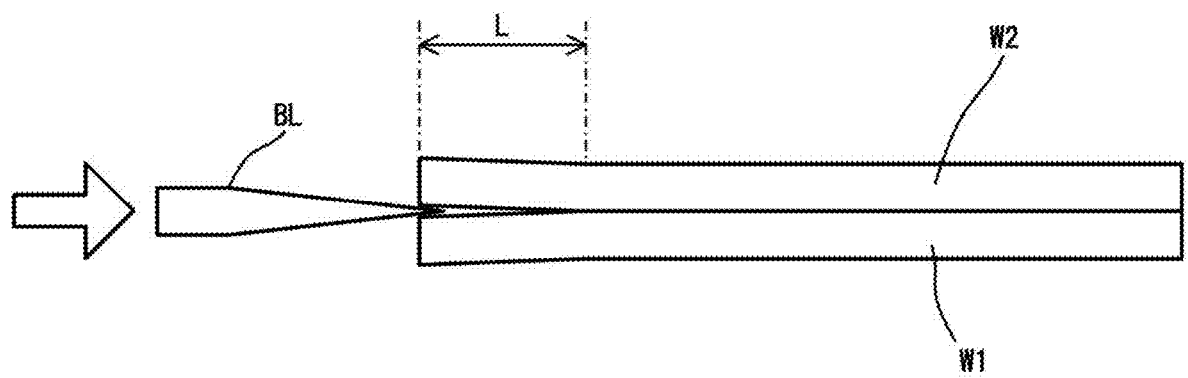
FIG. 10A is a diagram for a description of a measurement method for measuring bonding strength (in terms of surface energy) between substrates by a blade insertion method.
Figure 10B:
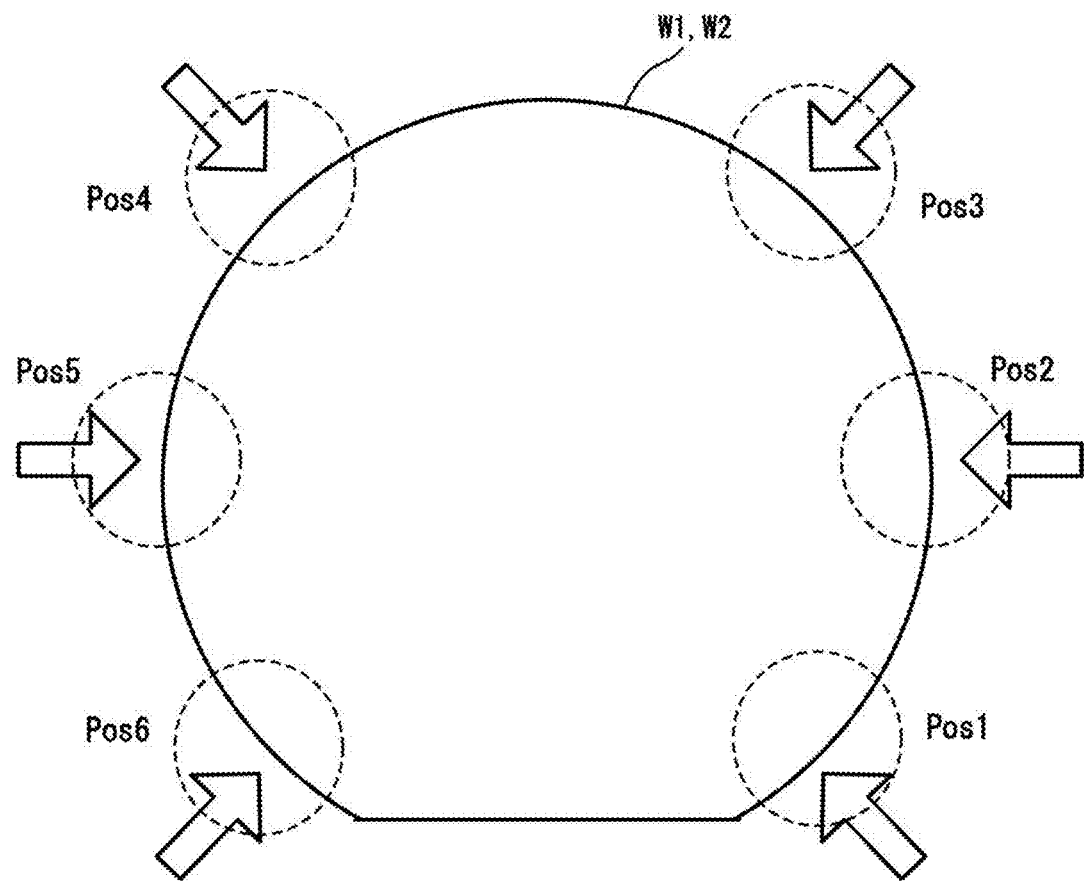
FIG. 10B is a diagram for a description of an evaluation method for evaluating the bonding strength according to the embodiment.

In addition, the evaluation of bonding strength between the substrates W1 and W2 for each of Samples 1 to 22 was performed by measuring bonding strength (in terms of surface energy) using a crack and opening method that is performed by inserting a blade. In the crack and opening method, first, peel length L of two substrates W1 and W2 bonded to each other at the time when a blade BL like, for example, a blade of a razor is inserted into a bonded portion of the substrates W1 and W2 from the periphery of the substrates W1 and W2 as illustrated by an arrow in FIG. 10A is measured. As the blade BL, for example, a blade with a thickness of 100 μm is used. In addition, as illustrated in FIG. 10B, peel lengths L from blade contact points at the time when the blade BL is inserted at six positions (Pos1, Pos2, Pos3, Pos4, Pos5, and Pos6) on the peripheral portion of the two substrates W1 and W2 bonded to each other (see arrows in FIG. 10B) were measured. By calculating strength of the bonding interface of the substrates W1 and W2 in terms of surface energy per unit area from the peel length L with respect to each of the six positions on the peripheral portion of the substrates W1 and W2, the evaluation of the bonding strength between the substrates W1 and W2 was performed. Note that, when bonding strength (in terms of surface energy) Eb is calculated from the peel length L, a relational equation expressed by the formula (1) below was used.

[Math. 1]

$$Eb = \frac{3 \times Y \times Ts^3 \times Tb^2}{32 \times L^4} \quad \text{Formula (1)}$$

In the above formula, Y indicates Young's modulus, Ts indicates thickness of the substrates W1 and W2, and Tb indicates thickness of the blade BL. In the evaluation of the bonding strength between the substrates W1 and W2 for Samples 1 to 14, the Young's modulus Y was set to 6.5×10$^{10}$ N/m$^2$, the thickness Ts of the substrates W1 and W2 was set to 0.0011 m (1.1 mm), and the thickness Tb of the blade BL was set to 0.0001 m (0.1 mm). According to the computation formula, the shorter the peel length is, the larger the bonding strength becomes. Average values of peel lengths and bonding strengths (in terms of surface energy) at the six points on the peripheral portion of the substrates W1 and W2 and the numbers of measurement points at which bulk fractures occurred are shown in Table 8. Note that values of the bonding strength (in terms of surface energy) indicate that the larger the calculated bonding strength (in terms of surface energy) is, the larger the bonding strength between the substrates W1 and W2 is. In addition, a bonding strength of less than 1 J/m$^2$ means an insufficient strength and the bonding strength is required to be greater than or equal to 1 J/m$^2$, a bonding strength of 1.5 J/m$^2$ or more is a magnitude that enables a bonded product to be generally determined to be a non-defective product, it is preferable that the bonding strength exceed 2 J/m$^2$, and it is more preferable that the bonding strength cause a bulk fracture. In addition, since it can be assumed that, regarding samples that caused bulk fractures, the shorter the peel length is, the higher the bonding strength is, peel lengths are also included in the table.

Evaluation results of the bonding strength between the substrates W1 and W2 for Samples 1 to 20 are shown in Table 8 below. Note that, in Table 8, entries in the column "Sample name" respectively correspond to Samples 1 to 14 described afore. Each value in the column "Peel length" indicates an average value of peel lengths at the six positions ("Pos1" to "Pos6") on the peripheral portion of the two substrates W1 and W2 illustrated in FIG. 10B. In addition, each value in the column "Bonding strength (in terms of surface energy)" indicates an average value of bonding strengths (in terms of surface energy) at the six positions ("Pos1" to "Pos6") on the peripheral portion of the two substrates W1 and W2 illustrated in FIG. 10B, and, for a sample where bulk fractures occurred at all the six positions on the peripheral portion of the two substrates W1 and W2, an estimated bonding strength is included. Further, each value in the column "Number of bulk fractured positions" indicates the number of positions at which a bulk fracture occurred among the six positions on the peripheral portion of the two substrates W1 and W2. With regard to a sample the bonding strength of which reached a bulk fracture strength (2.5 J/m$^2$), comparison is made in the peel length and the number of bulk fractured positions. However, since evaluation results cannot be simply compared in peel length in the case where the bonding strength is greater than or equal to the bulk fracture strength because, as combinations of the substrates W1 and W2, three combinations, namely a combination of a $SiO_2$ substrate and a Si substrate, a combination of glass substrates with each other, and a combination of Si substrates with oxide film with each other, were employed, an estimated bonding strength is included.

TABLE 8

| Sample name | Peel length(mm) | Bonding strength (in terms of surface energy) (J/m$^2$) | Number of bulk fractured positions |
| --- | --- | --- | --- |
| Sample1 | 11.17 | 3.65 | 5 |
| Sample2 | 11.83 | 2.89 | 5 |
| Sample3 | 12.33 | 2.45 | 3 |
| Sample4 | 14.17 | 1.41 | 0 |
| Sample5 | 12.25 | 2.52 | 4 |
| Sample6 | 12.58 | 2.26 | 4 |
| Sample7 | 14.00 | 1.48 | 0 |
| Sample8 | 14.08 | 1.44 | 0 |
| Sample9 | 19.17 | 0.42 | 0 |
| Sample10 | 19.00 | 0.44 | 0 |
| Sample11 | 11.75 | 2.98 | 5 |
| Sample12 | 12.75 | 2.15 | 2 |
| Sample13 | 13.83 | 1.55 | 2 |
| Sample14 | 16.25 | 0.81 | 0 |
| Sample15 | 19.3 | 0.59 | 0 |
| Sample16 | 5.1 | 3.5 | 6 |
| Sample17 | 17.3 | 0.9 | 0 |
| Sample18 | 12.3 | 2.5 | 3 |
| Sample19 | 11.83 | 2.89 | 4 |
| Sample20 | 17.58 | 0.49 | 0 |

For example, for both Samples 1 and 2, the bonding strengths (in terms of surface energy) were greater than or equal to 2.5 J/m$^2$ and five positions at which the bonding strength reached the bulk fracture strength existed. Since the substrate W2, which is formed of a Si substrate, does not have a native oxide film formed on the bonding surface, an oxide film is formed on the bonding surface by performing the $O_2$ RIE treatment. As for the substrate W2, since the bonding surface thereof is subjected to the $N_2$ radical treatment even when the $N_2$ RIE treatment is omitted, it is considered that the bonding surface is in the afore-described N-activated state. In fact, for Samples 1 and 2, although the $O_2$ RIE treatment that forms an oxide film for hydrophilic bonding on the bonding surface of the substrate W1, which is a Si substrate, is performed, the $N_2$ RIE treatment is omitted. From the fact that, in spite of this configuration, sufficient bonding strength is achieved, it is considered that the $N_2$ radical treatment causes the bonding surface of the substrate W1 to be in the afore-described N-activated state even when the $N_2$ RIE treatment is not performed. In other words, it is found that the $N_2$ radical treatment largely contributes to the achievement of the N-activated state on the bonding surfaces of the substrates W1 and W2. In addition, based on the result of the evaluation on the bonding strength (in terms of surface energy) for Samples 1 and 2, it is found that exposure of the substrates W1 and W2 to water gas causes the bonding strength to be improved compared with a case where the substrates W1 and W2 are exposed to atmospheric air. Based on this result, it is found that water molecules contained in the atmosphere contribute to hydrophilic bonding between the substrates W1 and W2. In addition, since atmospheric air contains substances other than water and the substances other than water in atmospheric air adsorb on the bonding surfaces of the substrates W1 and W2 that are in the N-activated state, the number of OH groups formed on the bonding surfaces is accordingly reduced. In contrast, when water gas is fed, a large number of OH groups are formed on the bonding surfaces of the substrates W1 and W2 that are in the N-activated state. It is considered that, for this reason, exposure to water gas caused the bonding strength between the substrates W1 and W2 to be improved.

Based on the result of the evaluation on the bonding strength (in terms of surface energy) and the number of bulk fractured positions for Samples 2 to 7, it is found that time required from when the activation treatment in the activation treatment device 2 is finished to when the bonding surfaces of the substrates W1 and W2 are exposed to atmospheric air influences the bonding strength between the substrates W1 and W2. In the substrate bonding system according to the present embodiment, time required from when the activation treatment in the activation treatment device 2 is finished to when the substrates W1 and W2 are exposed to atmospheric air on the second transportation device 84 is approximately 5 min and time required from when the activation treatment is finished to when the substrates W1 and W2 are exposed to atmospheric air in the load lock chamber 83 is approximately 10 min, and, based on this result, it is found that the longer the time required from when the activation treatment is finished to when the substrates W1 and W2 are exposed to atmospheric air becomes, the lower the bonding strength between the substrates W1 and W2 becomes.

Based on the result of the evaluation on the bonding strength (in terms of surface energy) and the number of bulk fractured positions for Samples 2 and 8, it is found that the $N_2$ radical treatment more largely contributes to the bonding strength between the substrates W1 and W2 than the $N_2$ RIE treatment. Based on this result, it is considered that a larger number of OH groups are formed on the bonding surfaces of the substrates W1 and W2 that are in the N-activated state at the time of the $N_2$ radical treatment than at the time of the $N_2$ RIE treatment. In addition, based on the result of the evaluation on the bonding strength (in terms of surface energy) for Samples 8 and 9, it is found that, even when the substrate W2 is not subjected to the $N_2$ radical treatment, subjecting the substrate W2 to the $N_2$ RIE treatment enables a comparatively high bonding strength to be obtained. Based on this result, it is found that subjecting the substrate W2 to the $N_2$ radical treatment or the $N_2$ RIE treatment largely influences improvement in the bonding strength between the substrates W1 and W2. Note that, in the comparison between Samples 9 and 10, there was no significant difference in the bonding strength even when, in the case where the substrate W2 is subjected to neither the $N_2$ radical treatment nor the $N_2$ RIE treatment, waiting time under reduced pressure after activation treatment was changed. From this result, it is revealed that only the N-activated state by nitrogen influences time to exposure to gas containing water. In addition, a strength difference is immediately apparent, and it is considered that, by coming into contact with water, a bonding surface that is in the unstable N-activated state forms a larger number of OH groups that contribute to bonding than in a normal condition without N-activated state.

Based on the result of the evaluation on the bonding strength (in terms of surface energy) and the number of bulk fractured positions for Samples 2 and 11 to 14, it is found that the higher is gas pressure at the time of transportation to the cleaning device 3 after the activation treatment in the activation treatment device 2 is finished, the higher the bonding strength between the substrates W1 and W2 is improved. Specifically, the bonding strength improved as the gas pressure at the time of transportation increased in such a manner that: when the gas pressure was 1 Pa, the bonding strength was low at 0.81 J/m$^2$; when the gas pressure was 10

Figure 11A:
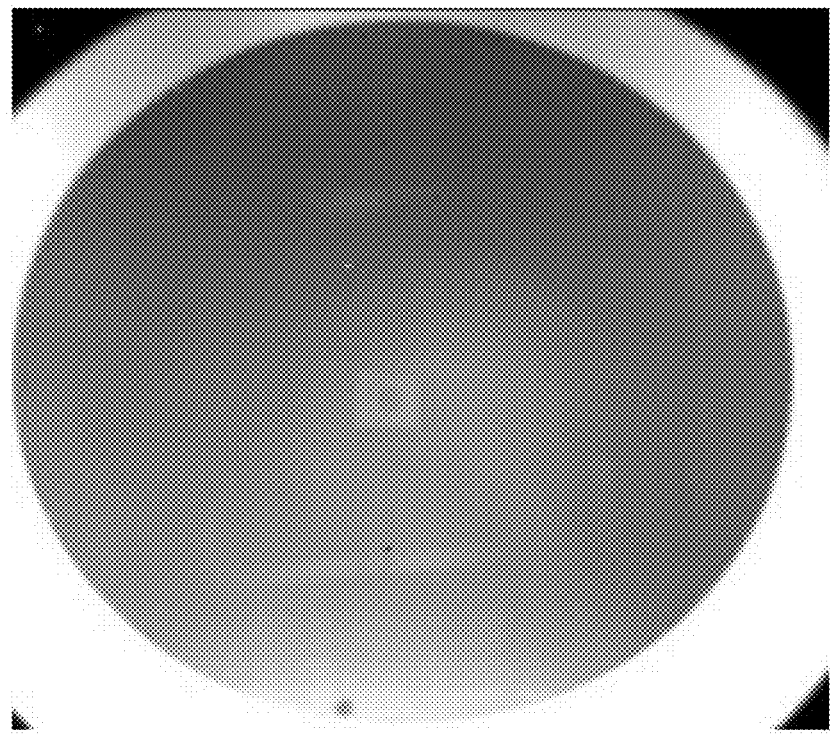
FIG. 11A is an appearance photograph of a substrate in the case where gas pressure at the time of transportation is 1000 Pa.
Figure 11B:
FIG. 11B is an appearance photograph of a substrate in the case where gas pressure at the time of transportation is 10000 Pa.

Pa, the bonding strength was 1.55 J/m$^2$; when the gas pressure was 100 Pa, the bonding strength was 2.15 J/m$^2$; when the gas pressure was 1000 Pa, the bonding strength was 2.89 J/m$^2$; and when the gas pressure was 10000 Pa, the bonding strength was 2.98 J/m$^2$. However, although no void was observed in the bonded portion between the substrates W1 and W2 for Sample 2 and 11 to 13, a void occurred in the bonded portion between the substrates W1 and W2 for Sample 14. For example, although no void was confirmed on Sample 2, as illustrated in FIG. 11A, occurrence of a void was confirmed on Sample 14, as illustrated in FIG. 11B. It is considered that this is because, when the gas pressure during transportation of the substrates W1 and W2 is high, a void due to drawing-in of air into between the substrates W1 and W2 becomes likely to occur. Alternatively, it is considered that, when the gas pressure during transportation of the substrates W1 and W2 was high, water remained in the bonded portion between the substrates W1 and W2 and a void occurred caused by the water having vaporized at the time of the heat treatment in the substrate bonding device 1. Note that, although, when the process was performed with the cleaning step in the cleaning device 3 omitted, wettability was reduced and a void caused by adherence of particles occurred, a tendency that the lower the gas pressure at the time of transportation is, the smaller the number of voids becomes was confirmed.

Based on the result of the evaluation on the bonding strength (in terms of surface energy) and the number of bulk fractured positions for Samples 15 to 18, it is found that use of nitrogen enabled the bonding strength to be improved in such a manner that: when only the O$_2$ RIE treatment was performed, the bonding strength was low at 0.48 J/m$^2$; when the N$_2$ radical treatment was performed after the O$_2$ RIE treatment, the bonding strength was 0.9 J/m$^2$; and, when the N$_2$ radical treatment was performed after the N$_2$ RIE treatment, the bonding strength was 2.5 J/m$^2$. Note that performing the O$_2$ RIE treatment before performing the N$_2$ RIE treatment caused wettability between the substrates W1 and W2 to be improved and the bonding strength between the substrates W1 and W2 to be improved and, at the same time, the number of voids occurring between the substrates W1 and W2 to be reduced. It is considered that this is because adhering substances, such as organic substances, that have adhered to the bonding surfaces of the substrates W1 and W2 being removed by the O$_2$ RIE treatment caused a larger number of OH groups to be formed on the bonding surfaces of the substrates W1 and W2 that were in the N-activated state in the subsequent N$_2$ RIE treatment and N$_2$ radical treatment. It is also considered that organic substances that have adhered to the bonding surfaces of the substrates W1 and W2 being removed by the O$_2$ RIE treatment caused wettability of the bonding surfaces of the substrates W1 and W2 to be increased.

Based on the result of the evaluation on the bonding strength (in terms of surface energy) and the number of bulk fractured positions for Samples 15 to 18 and Samples 19 and 20, in the case of not only the bonding between a Si substrate and a SiO$_2$ substrate but also the bonding between SiO$_2$ substrates and the bonding between a glass substrate and a Si substrate with an oxide film, by performing irradiation of N$_2$ radicals or the N$_2$ RIE treatment, a similar tendency to the tendency in the case of the bonding between a Si substrate and a SiO$_2$ substrate was observed and similar tendencies were also observed for other process conditions. In addition, based on the result of the evaluation on the bonding strength (in terms of surface energy) and the number of bulk fractured positions for Samples 19 and 20, it is found that, in the case of a substrate obtained by depositing and forming an oxide film on a Si substrate by a chemical vapor deposition (CVD) method, employing the substrate bonding method according to the present embodiment enabled the bonding strength between substrates to be substantially improved from 0.59 J/m$^2$ that was a bonding strength between substrates bonded by a conventional substrate bonding method to a bonding strength greater than or equal to the bulk fracture strength (2.89 J/m$^2$). In addition, even in the case where, without performing the O$_2$ RIE treatment, the N$_2$ RIE treatment and the N$_2$ radical treatment were performed, exposing the substrates W1 and W2 to atmospheric air within a predetermined time enabled a higher bonding strength than ever before that enables insufficient strength at a level exceeding 1 J/m$^2$ to be avoided to be achieved.

Figure 12A:
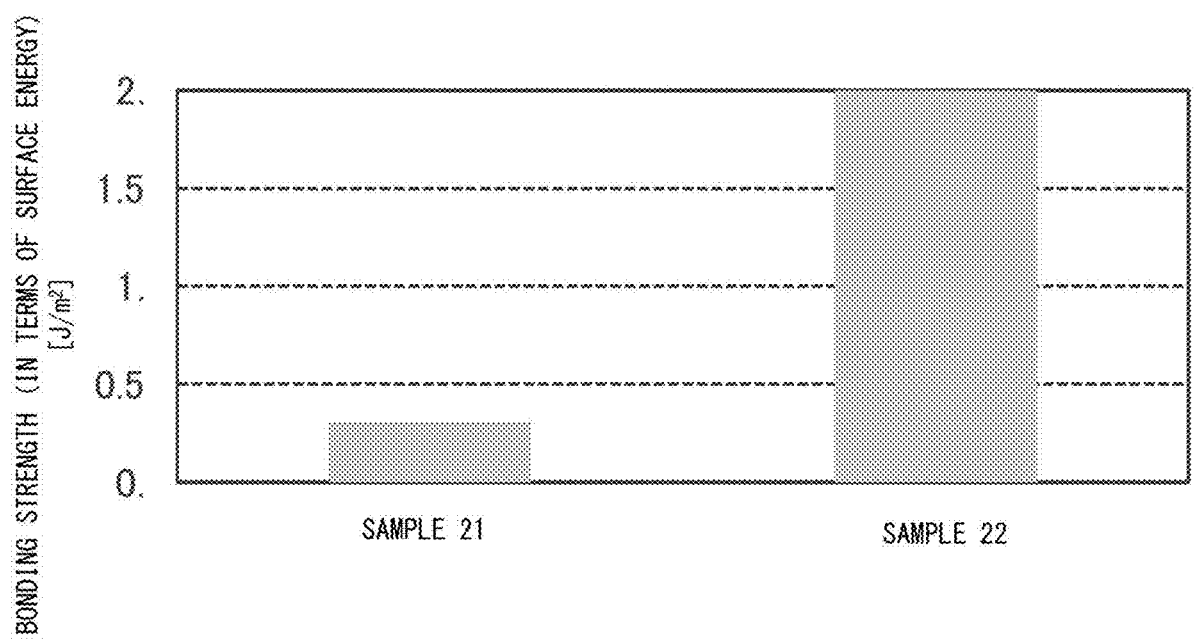
FIG. 12A is a graph illustrating bonding strengths of respective ones of Samples 21 and 22.
Figure 12B:
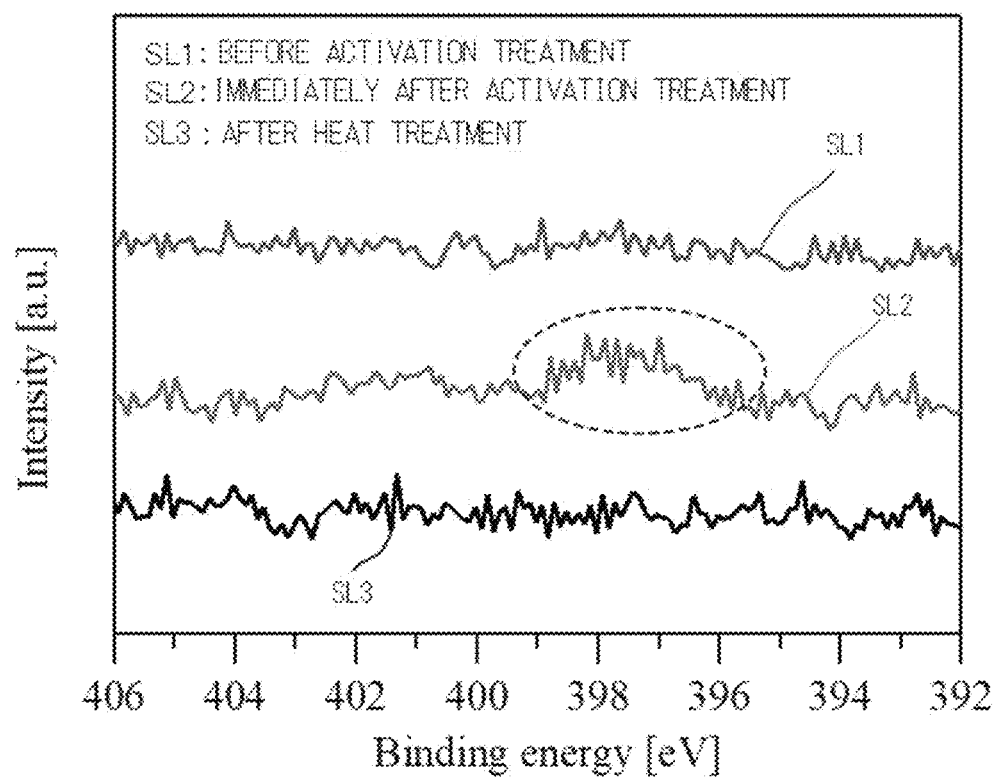
FIG. 12B is a diagram illustrating XPS spectra of Sample 22 with respect to respective ones of a bonding surface of a substrate before activation treatment, the bonding surface of the substrate immediately after completion of the activation treatment, and the bonding surface of the substrate after heat treatment.

In addition, as illustrated in FIG. 12A, while the bonding strength (in terms of surface energy) of Sample 21 was 0.31 J/m$^2$, the bonding strength of Sample 22 was 2.0 J/m$^2$ that is equivalent to the bulk fracture strength, and it is found that Sample 22 enables the bonding strength to be substantially improved compared with Sample 21. In addition, when X-ray photoelectron spectroscopy (XPS) spectra were measured with respect to the bonding surfaces of the substrates W1 and W2 of Sample 22, an N1$s$ peak derived from an oxynitride that was not observed before the activation treatment was detected around 396 eV to 399 eV after the activation treatment, as illustrated by curves SL1 and SL2 in FIG. 12B. Based on this result, it is found that the activation treatment caused SiON that is an oxynitride to be formed on the bonding surfaces of the substrates W1 and W2. When the substrates W1 and W2 after activation treatment were subjected to heat treatment under the same conditions as the conditions for heat treatment for Samples 21 and 22, disappearance of the N1$s$ peak was confirmed, as illustrated by curves SL2 and SL3 in FIG. 12B. Based on this result and the result that, as illustrated in FIG. 12A, the bonding strength of Sample 22 is substantially improved compared with the bonding strength of Sample 21, it is considered that, in Sample 22, the oxynitride (SiON) is replaced by OH groups that contribute to hydrogen bonds in the bonded portion between the substrates W1 and W2.

As described in the foregoing, in the substrate bonding system according to the present embodiment, the bonding surfaces to be bonded to each other of the respective ones of the two substrates W1 and W2 are activated by subjecting the bonding surfaces of the substrates W1 and W2 to the reactive ion etching using nitrogen gas and the irradiation of nitrogen radicals. The N-activated state of the bonding surfaces of the substrates W1 and W2 that is formed by this activation is unstable, and, when left untreated, the bonding strength is reduced because the activated state is to be deactivated. In order to avoid this inconvenience, the bonding surfaces of the substrates W1 and W2 are required to be brought into contact with water molecules within a predetermined standard time after having been activated. Thus, in the substrate bonding system according to the present embodiment, the bonding surfaces of the substrates W1 and W2 are exposed to atmospheric air or water gas within a predetermined standard time after the bonding surfaces of the substrates W1 and W2 are activated. Since this processing enables the bonding surfaces of the substrates W1 and W2 to come into contact with water molecules while being N-activated, a large number of oxynitrides can be formed on the bonding surfaces of the substrates W1 and W2. When heat treatment is performed after the substrates W1 and W2 are temporarily bonded by bringing the bonding surfaces of the substrates W1 and W2 into contact with each other, a large number of oxynitrides existing between the bonding surfaces of the substrates W1 and W2 being replaced by OH groups enable a comparatively large number of hydrogen bonds to be formed. Therefore, when hydrogen bonds formed between the bonding surfaces of the substrates W1 and W2 temporarily bonded to each other are converted to covalent bonds by heat treatment, the substrates W1 and W2 are bonded to each other via a comparatively large number of covalent bonds, as a result of which it is possible to increase the bonding strength between the substrates W1 and W2.

Conventionally, OH groups are generated only after the substrates W1 and W2 are subjected to heat treatment after having been temporarily bonded to each other and the bonding strength between the substrates W1 and W2 is thereby improved. In contrast, in the substrate bonding method according to the present embodiment, by bringing the bonding surfaces of the substrates W1 and W2 into contact with water molecules while a large number of oxynitrides (N groups) have been generated on the bonding surfaces by subjecting the bonding surfaces of the substrates W1 and W2 to the activation treatment, a large number of oxynitrides (N groups) on the bonding surfaces of the substrates W1 and W2 are respectively replaced by OH groups. Therefore, a large number of OH groups are generated on the bonding surfaces of the substrates W1 and W2. In other words, the present embodiment relates to an invention of a method for generating a large number of OH groups on the bonding surfaces of the substrates W1 and W2 at a stage before subjecting the bonding surfaces of the substrates W1 and W2 to heat treatment after having subjected the bonding surfaces of the substrates W1 and W2 to the activation treatment. Therefore, since, after the bonding surfaces of the substrates W1 and W2 are subjected to the activation treatment, a large number of OH groups have already been generated even when water having adhered to the bonding surfaces of the substrates W1 and W2 are removed in the case where the bonding surfaces of the substrates W1 and W2 are brought into contact with each other in an environment in which a degree of vacuum is comparatively high, the substrates W1 and W2 are temporarily bonded to each other firmly.

In addition, in a conventional method for bonding substrates to each other, bonding surfaces are cleaned by spraying water on the bonding surfaces after wettability of the bonding surfaces is increased by subjecting the bonding surfaces of the substrates to RIE treatment, and subsequently the substrates are temporarily bonded to each other by bringing the bonding surfaces of the two substrates into contact with each other with water molecules interposed between the bonding surfaces of the substrates under atmospheric pressure. It has been a general practice to bond the two substrates to each other by subjecting the two substrates temporarily bonded to each other to heat treatment. In this process, in order to increase the bonding strength between two substrates, treatment temperature at the time of heat treatment was required to be set to approximately 350° C. In this case, in order to prevent occurrence of a void in a bonded portion between two substrates, a technology to prevent drawing-in of air into between the two substrates by bringing the two substrates into contact with each other with a central portion of at least one of the two substrates pressed and thereby bent is often employed. However, there has been a case where, in the case where a conductor pattern is formed on a substrate, location dependency occurs in wetting speed of the substrate due to the conductor pattern and occurrence of a void due to drawing-in of air into between two substrates cannot be reduced. In addition, since the bonding surfaces of substrates are cleaned by spraying water on the bonding surfaces of the substrates, there has been a case where, when heat treatment was performed with water remaining on the bonding surfaces of the substrates, the remaining water caused occurrence of a void. In particular, in the case of a Si substrate, an oxide film that absorbs water molecules is thin and occurrence of a void due to water remaining on a bonding surface has been prominent. Therefore, a bonding method for eliminating drawing-in of air into between two substrates and removing water remaining on bonding surfaces by bonding the two substrates to each other under reduced pressure is provided. In a conventional substrate bonding method in which two substrates are bonded to each other under atmospheric pressure, after wettability of a bonding surface of a substrate is increased by performing $O_2$ RIE treatment, water molecules are caused to adhere to the bonding surface, as illustrated in section (A-1) of FIG. 13. When two substrates are heated with water molecules interposed between the bonding surfaces of the respective ones of the two substrates as illustrated in section (A-2) of FIG. 13, water molecules having adhered to the substrates change to OH groups and bonds between the bonding surfaces change to strong covalent bonds, as illustrated in section (A-3) of FIG. 13. However, in the substrate bonding method in which substrates are bonded to each other under reduced pressure, when, after water molecules are caused to adhere to bonding surfaces as illustrated in section (B-1) of FIG. 13, the substrates are placed under reduced pressure, water molecules having adhered to the substrates evaporate and the number of water molecules on the substrates is reduced, as illustrated in section (B-2) of FIG. 13. As a result, the number of OH groups formed on the bonding surfaces of the substrates is reduced, and the substrates are caused to be bonded to each other with OH groups scarcely formed on the bonding surfaces of the substrates, as illustrated in section (B-3) of FIG. 13. In this case, it has been difficult to firmly bond the substrates to each other. In particular, when an oxide film is formed on a substrate by a CVD method after a conductor pattern is formed on the substrate and subsequently the substrate is polished by a chemical mechanical polishing (CMP) method, a bonding strength of 1 J/m$^2$ or more has not been achieved because denseness of an oxide film is low.

In contrast, according to the substrate bonding system according to the present embodiment, OH groups are formed on the bonding surfaces of the substrates W1 and W2 in the activation treatment, as illustrated in section (C-1) of FIG. 13. Thus, even when water molecules having adhered to the substrates W1 and W2 subsequently evaporate under reduced pressure, a state in which a comparatively large number of OH groups are formed on the bonding surfaces of the substrates W1 and W2 is maintained, as illustrated in section (C-2) of FIG. 13. Therefore, performing heat treatment after the two substrates are temporarily bonded to each other through hydrogen bonding via OH groups causes the two substrates to be bonded to each other via strong covalent bonds, as illustrated in section (C-3) of FIG. 13. Thus, it is possible to firmly bond the substrates W1 and W2 to each other under reduced pressure. Therefore, it is possible to firmly bond the substrates W1 and W2 to each other while preventing a void due to drawing-in of air into between the substrates W1 and W2 or water remaining on the bonding surfaces of the substrates W1 and W2 from occurring.

In addition, in order to prevent a void from occurring after heat treatment in the bonded portion between the substrates W1 and W2, reducing treatment temperature at the time of heat treatment is also requested. Further, in order to prevent reduction in positional precision due to thermal expansion of the substrates W1 and W2 or occurrence of a warp or a crack of the substrates W1 and W2 in the bonding of the substrates W1 and W2 formed of materials having different thermal expansion coefficients to each other, setting heat treatment temperature to less than 200° C., and preferably approximately 150° C., is requested. In contrast, according to the substrate bonding system according to the present embodiment, as indicated by the afore-described evaluation result of bonding strength, performing heat treatment after the substrates W1 and W2 are temporarily bonded to each other under the conditions of a treatment temperature of 150° C. and a treatment time of 7 hours enables a high bonding strength to be achieved. In other words, even when the treatment temperature of heat treatment is set to 150° C. or less, it is possible to secure a high bonding strength.

Conventionally, after activation treatment in the activation treatment device 2 was finished, the substrates W1 and W2 were transported from the second transportation device 84 to the load lock chamber 83 under reduced pressure and were subsequently exposed to atmospheric air. In this case, approximately 10 min elapsed before the substrates W1 and W2 were exposed to atmospheric air, and sufficient bonding strength was not able to be achieved. In contrast, in the substrate bonding system according to the present embodiment, by exposing the substrates W1 and W2 to atmospheric air in the activation treatment device 2 or the second transportation device 84 after the activation treatment in the activation treatment device 2 is finished, time required from the finish of activation treatment to atmospheric air exposure is reduced, and the bonding strength between the substrates W1 and W2 can be increased. In addition, by exposing the substrates W1 and W2 to water gas in the activation treatment device 2 or the second transportation device 84 after the activation treatment in the activation treatment device 2 is finished, the bonding strength between the substrates W1 and W2 can be further increased. In addition, even when, after the substrates W1 and W2 were exposed to water gas in the activation treatment device 2, the inside of the chamber 212 was once brought into a reduced pressure state and, after having been transported to the load lock chamber 83 under reduced pressure, the substrates W1 and W2 were exposed to atmospheric air in order to input the substrates W1 and W2 to the cleaning device 3, a bulk fracture occurred and there was no large difference in the bonding strength between the substrates W1 and W2. Based on this result, it is found that OH groups formed on the bonding surfaces of the substrates W1 and W2 in the N-activated state do not disappear even when the substrates W1 and W2 are put under reduced pressure. It is also found that, in the case where the bonding surfaces of the substrates W1 and W2 are exposed to water gas, when, even without feeding water gas having approximately the same pressure as atmospheric pressure to the chamber 212, the chamber 212 is filled with several percent of water molecules, a large number of OH groups are formed on the bonding surfaces of the substrates W1 and W2. In this case, since it is only required to only expose substrates to water gas in the activation treatment device 2 for a short period of time and transport the substrates as it is in vacuum without returning pressure to the atmospheric pressure, a takt time of the devices can be reduced.

In addition, conventionally, when the substrates W1 and W2 were transported from the cleaning device 3 to the substrate bonding device 1, the substrates W1 and W2 were transported under a reduced pressure of approximately 1 Pa and bonding of the substrates W1 and W2 to each other was performed under a pressure of approximately 1 Pa in the substrate bonding device 1. In contrast, in the substrate bonding system according to the present embodiment, the substrates W1 and W2 are transported from the cleaning device 3 to the substrate bonding device 1 under a pressure of 10 Pa or more and 1000 Pa or less. Because of this configuration, evaporation of water molecules adhering to the substrates W1 and W2 is prevented and bonding strength between the substrates W1 and W2 can be increased. In other words, it is possible to leave water molecules on the bonding surfaces of the substrates W1 and W2 in the bonding step in the substrate bonding device 1, and it is possible to form a larger number of OH groups on the bonding surfaces by water molecules remaining on the bonding surfaces in addition to bringing the bonding surfaces of the substrates W1 and W2 into an N-activated state through the activation treatment by the activation treatment device 2. Therefore, it is possible to further increase the bonding strength between the substrates W1 and W2. In addition, when, in the activation treatment, only treatment using oxygen gas is performed without performing etching treatment using nitrogen gas and irradiation of nitrogen radicals, a similar result was also obtained.

Although the embodiment of the present disclosure was described above, the present disclosure is not limited to the configuration of the afore-described embodiment. For example, the substrate bonding system may be a substrate bonding system including a water gas feeder (not illustrated) to feed water gas into the load lock chamber 83 or the second transportation device 84. The water gas feeder generates water gas by mixing carrier gas, such as argon (Ar), nitrogen ($N_2$), helium (He), and oxygen ($O_2$), and vaporized water and feeds the generated water gas. The water gas feeder is connected to the load lock chamber 83 via a feeding valve and a feeding pipe. The flow rate of water gas and carrier gas to be fed into the load lock chamber 83 is adjusted by controlling an opening degree of the feeding valve. Note that the water gas feeder may have a configuration in which molecules or clusters of molecules of water ($H_2O$) are accelerated and radiated toward the bonding surfaces of the substrate W1 or W2. In this configuration, the water gas feeder may include a particle beam source to emit accelerated water ($H_2O$) particles. In this case, the particle beam source may have a configuration in which water gas is generated using, for example, an ultrasonic wave generation element. Alternatively, the water gas feeder is only required to have a configuration to generate a particle beam of water by feeding the afore-described mixed gas of carrier gas and water ($H_2O$) generated by bubbling or ultrasonic waves to the afore-described particle beam source and radiate the generated particle beam to the bonding surfaces of the substrates W1 and W2. In addition, the load lock chamber 83 may be opened to atmospheric air after the bonding surfaces of the substrates W1 and W2 are exposed to water gas in the load lock chamber 83 without opening the load lock chamber 83 to atmospheric air. In addition, in place of water gas, a gas containing H or OH groups may be fed to the bonding surfaces of the substrates W1 and W2.

In the embodiment, the activation treatment device may be an activation treatment device including a particle beam source to, by irradiating the substrates W1 and W2 with a particle beam, activate the bonding surfaces of the substrates W1 and W2. An activation treatment device 3002 according to the present variation includes a chamber 3212, a stage 3210 to hold the substrate W1 or W2, a particle beam source 3061, and a beam source transporter 3063, as illustrated in, for example, FIG. 14. Note that, in FIG. 14, the same reference signs as those in FIG. 2 are assigned to the same constituent components as those in the embodiment. The activation treatment device 3002 also includes a plasma chamber 3213, an induction coil 215, and a high-frequency power source 216. The activation treatment device 3002 further includes a stage driver 3623 to rotation-drive the stage 3210 about an axis orthogonal to the thickness direction of the stage 3210 as illustrated by an arrow AR303 in FIG. 14. In addition, the stage 3210 includes, for example, a vacuum chuck and, when the substrate W1 or W2 is input, sucks and holds the substrate W1 or W2.

The particle beam source 3061 is, for example, a fast atom beam (FAB) source and includes a discharge chamber 3612, an electrode 3611 arranged in the discharge chamber 3612, a beam source driver 3613, and a gas feeder 3614 to feed nitrogen gas into the discharge chamber 3612. In a peripheral wall of the discharge chamber 3612, FAB radiation ports 3612a for emitting neutral atoms are formed. The discharge chamber 3612 is formed of a carbon material. In this configuration, the discharge chamber 3612 is formed in a long box shape, and a plurality of FAB radiation ports 3612a is arranged side by side in a straight line in the longitudinal direction thereof. The beam source driver 3613 includes a plasma generator (not illustrated) to generate plasma of nitrogen gas in the discharge chamber 3612 and a DC power source (not illustrated) to apply DC voltage between the electrode 3611 and the peripheral wall of the discharge chamber 3612. The beam source driver 3613 applies DC voltage between the peripheral wall of the discharge chamber 3612 and the electrode 3611 with plasma of nitrogen gas generated in the discharge chamber 3612. On this occasion, nitrogen ions in the plasma are attracted to the peripheral wall of the discharge chamber 3612. On this occasion, nitrogen ions moving to the FAB radiation ports 3612a receive electrons from the peripheral wall of the discharge chamber 3612, which is formed of a carbon material, in outer peripheral portions of the FAB radiation ports 3612a at the time of passing through the FAB radiation ports 3612a. The nitrogen ions are converted to electrically neutralized nitrogen atoms and are discharged to the outside of the discharge chamber 3612. However, some nitrogen ions cannot receive electrons from the peripheral wall of the discharge chamber 3612 and are discharged to the outside of the discharge chamber 3612 while remaining as nitrogen ions. In addition, a portion or all of a FAB housing may be formed of Si. Since configuring the FAB housing in such a manner causes Si particles to be discharged at the same time as an Ar beam, Si is implanted into an interface, and, since OH groups are attached to the implanted Si, a larger number of OH groups can be generated, as a result of which it is possible to increase bonding strength.

The beam source transporter 3063 includes a support rod 3631 having a long length and inserted into a hole 3212a formed in the chamber 3212 and configured to support the particle beam source 3061 at one end portion, a support base 3632 to support the support rod 3631 at the other end portion of the support rod 3631, and a support base driver 3633 to drive the support base 3632. The beam source transporter 3063 also includes a bellows 3634 interposed between the outer peripheral portion of the hole 3212a of the chamber 3212 and the support base 3632 to maintain a degree of vacuum inside the chamber 3212. The support base driver 3633, by driving the support base 3632 in directions in which the support rod 3631 is inserted and removed into and from the chamber 3212 as illustrated by an arrow AR301 in FIG. 14, changes the position of the particle beam source 3061 in the chamber 3212, as illustrated by an arrow AR302 in FIG. 14. In this configuration, the beam source transporter 3063 moves the particle beam source 3061 in a direction orthogonal to a direction in which the FAB radiation ports 3612a thereof are arranged side by side.

The activation treatment device 3002 includes a nitrogen gas feeder 220A to feed nitrogen gas into the chamber 3212 through a feeding pipe 223A. When high-frequency current is supplied to the induction coil 215 while $N_2$ gas has been fed into a plasma chamber 3213, plasma PLM2 is formed in the plasma chamber 3213. On this occasion, only radicals contained in the plasma PLM2 generated in the plasma chamber 3213 are allowed to flow down to the lower side of the plasma chamber 3213 in the chamber 3212. Although, when a particle beam is radiated, pressure in the chamber 3213 is evacuated to the order of $10^{-3}$ Pa using, for example, a turbomolecular pump, radical treatment is performed after the pressure in the chamber 3213 is increased to approximately several tens of Pa.

The activation treatment device 3002 according to the present variation moves the particle beam source 3061 in the X-axis direction while causing the particle beam source 3061 to irradiate the bonding surfaces of substrate W1 or W2 with a particle beam, as illustrated by, for example, an arrow AR304 in FIGS. 15A and 15B. In this processing, the activation treatment device 3002, for example, irradiates the bonding surface of the substrate W1 or W2 with a particle beam while moving the particle beam source 3061 in the +X-direction and subsequently irradiates the bonding surface of the substrate W1 or W2 with a particle beam while moving the particle beam source 3061 in the −X-direction. In addition, movement speed of the particle beam source 3061 is set to, for example, 1.2 to 14.0 mm/sec. Further, supplied power to the particle beam source 3061 is set to, for example, 1 kV and 100 mA. The flow rate of nitrogen gas or oxygen gas fed into the discharge chamber 3612 of the particle beam source 3061 is set to, for example, 100 sccm.

Next, the activation treatment device 3002, by turning over the stage 3210 as illustrated by an arrow AR306 in FIG. 16A, brings the substrate W1 or W2 into such an attitude that the bonding surface of the substrate W1 or W2 faces vertically upward. Then, the activation treatment device 3002 irradiates the bonding surface of the substrate W1 or W2 with nitrogen radicals, as illustrated by arrows AR307 in FIG. 16B.

In the case where each of the bonding surfaces of the substrates W1 and W2 is a so-called hybrid bonding surface that includes, for example, a region that is formed of Cu and serves as an electrode and a region that is formed of an oxide film and serves as an insulating layer, performing conventional RIE treatment with plasma causes a sheath region to be formed in a vicinity of the bonding surface of the substrate W1 or W2 and all ionized substances to be drawn in and attack the bonding surface of the substrate W1 or W2. When, on this occasion, Cu ions or Cu particles generated by the region formed of Cu being etched adhere to the region formed of an oxide film on the bonding surface of the substrate W1 or W2, bonding strength in the region formed of an oxide film deteriorates. In addition, when particles made of materials of the oxide film generated by the oxide film being etched adhere to the region that is formed of Cu and serves as an electrode, electrical resistance of the electrode increases. In contrast, according to the present configuration, since so-called FAB treatment using a particle beam is performed and plasma generated in the chamber 3212 is radiated as a beam, Cu ions, Cu particles, or particles made of materials of the oxide film generated by the region made of Cu or the region formed of the oxide film being etched are repelled without returning to the bonding surface of the substrate W1 or W2. Therefore, since, even when a particle beam is radiated on the bonding surface of the substrate W1 or W2, impurities are prevented from adhering to the bonding surface of the substrate W1 or W2, it is possible to improve the bonding strength between the substrates W1 and W2. Therefore, the present configuration is suitable for activation treatment of the substrates W1 and W2 having so-called hybrid bonding surfaces.

In addition, when, for example, an adhesive sheet on which chips obtained by dicing a substrate are stuck is treated in place of the substrate W1 or W2, the RIE treatment with plasma causes resin of which the adhesive sheet is made to adhere to the bonding surfaces of the chips. In contrast, the present configuration enables excellent activation treatment to be performed without resin of which an adhesive sheet is made adhering to the bonding surfaces of chips.

Although, in the embodiment, an example in which the activation treatment device 2 includes a plasma generation source that generates ICP was described, the present disclosure is not limited to the configuration, and the plasma generation source may be a plasma generation source that generates plasma by a microwave. As illustrated in, for example, FIG. 17, an activation treatment device 4002 according to the present variation includes a stage 210, a chamber 4212, a trap plate 4214, a waveguide 4215, a magnetron 4216, and a bias applier 217. Note that, in FIG. 17, the same reference signs as those in FIG. 2 are assigned to the same constituent components as those in activation treatment device 2 according to the embodiment. The activation treatment device 4002 also includes a nitrogen gas feeder 220A and an oxygen gas feeder 220B. The nitrogen gas feeder 220A includes a nitrogen gas storage 221A, a feeding valve 222A, and a feeding pipe 223A. The oxygen gas feeder 220B includes an oxygen gas storage 221B, a feeding valve 222B, and a feeding pipe 223B. On the stage 210, a substrate W1 or W2 is placed. The chamber 4212 is connected to the waveguide 4215 via a glass window 4213. The chamber 4212 is connected to a vacuum pump 201 via an exhaust pipe 202A and an exhaust valve 203A. When the exhaust valve 203A is put into the open state and the vacuum pump 201 is caused to operate, gas in the chamber 4212 is exhausted to the outside of the chamber 4212 through the exhaust pipe 202A and gas pressure in the chamber 4212 is reduced (decompressed). The trap plate 4214 is formed of, for example, a metal, a graphite, or the like and is maintained at a ground potential.

A microwave generated by the magnetron 4216 is fed into the chamber 4212 through the waveguide 4215. As the magnetron 4216, for example, a magnetron that generates a microwave having a frequency of 2.45 GHz can be employed. When a microwave is fed from the waveguide 4215 while $N_2$( ) gas has been fed into the plasma chamber 4212, plasma PLM is formed in a vicinity of the glass window 4213 in the chamber 4212 by the microwave. The trap plate 4214 traps ions contained in the plasma PLM and allows only radicals to flow down to the stage 210. The magnetron 4216, the nitrogen gas feeder 220A, and the trap plate 4214 constitute a plasma generation source that generates the plasma PLM in the chamber 4212 and feeds $N_2$( ) radicals in the plasma to the bonding surface of the substrate W1 or W2 supported by the stage 210.

In the activation treatment device 4002, physical etching treatment (RIE treatment) of the substrate W1 or W2 can be performed by feeding nitrogen gas and oxygen gas from the upper portion of the chamber 4212 while applying a bias to the stage 210 by the bias applier 217. In addition, the activation treatment device 4002 subjects the substrate W1 or W2 on the stage 210 to chemical treatment by generating ions or radicals in high density in an upper portion of the chamber 4212 by a microwave fed into the upper portion of the chamber 4212 and, when the generated ions and radicals pass through the trap plate 4214 maintained at the ground potential, trapping ions and allowing only radicals including neutral molecules to flow down to the stage 210 side of the chamber 4212.

In addition, in the embodiment, a configuration in which the activation treatment device 2 applies bias voltage to the stage 210 by the bias applier 217 while feeding nitrogen gas and oxygen gas from the upper portion of the chamber 212 at the time of the RIE treatment and stops the bias application to the stage at the time of the radical treatment was described. However, the present disclosure is not limited to the configuration, and the activation treatment device 2 may be an activation treatment device in which, for example, a trap plate (not illustrated) is arranged between the stage 210 and a region inside the plasma chamber 213. In this configuration, the trap plate is maintained at the ground potential.

In the activation treatment device 2 according to the embodiment, since, at the time of the radical treatment, ions are trapped in ICP plasma by an electric field formed in the plasma chamber 213 by the induction coil 215, it is possible to allow only radicals to flow down to the stage 210 side even without the trap plate. However, all ions are not trapped in the ICP plasma, and a certain number of ions fall to the stage 210 side. In contrast, in the activation treatment device according to the present variation, since ions are trapped by the trap plate in the radical treatment, it is possible to prevent ions from being radiated to the stage 210 side. In addition, in the activation treatment device 2 described in the embodiment, since, when a trap plate is disposed, current can be kept supplied to the induction coil 215 at the time of both the RIE treatment and the radical treatment, a large switching of current supplied to the induction coil 215 is unnecessary at the time of switching from the RIE treatment to the radical treatment. Thus, it is possible to reduce takt time required for the RIE treatment and the radical treatment of the substrates W1 and W2 and generate a larger number of ions or radicals.

In addition, although, in the afore-described variation, an example in which the trap plate is maintained at the ground potential was described, the present disclosure is not limited to the example, and it may be configured such that, at the time of the RIE treatment, the trap plate is put into a floating state instead of being maintained at the ground potential and, only at the time of the radical treatment, the trap plate is maintained at the ground potential. In this case, ions in the plasma PLM generated in the plasma chamber 213 are not trapped by the trap plate and fall to the stage 210 side at the time of the RIE treatment and are trapped by the trap plate only at the time of the radical treatment.

When the trap plate is not disposed, radicals ride on flows of nitrogen gas and oxygen gas and are radiated to the stage 210 at the time of the radical treatment. In contrast, in the present variation, in the radical treatment, ions in the plasma PLM generated in the plasma chamber 213 are drawn in to the trap plate and at the same time accelerated, when passing through holes of the trap plate, are supplied with electrons by the trap plate and neutralized, and are subsequently radiated to the substrate W1 or W2 placed on the stage 210.

Thus, it becomes possible to irradiate the substrate W1 or W2 with a larger number of radicals including neutral molecules.

Further, in the afore-described variation, it may be configured to, for example, maintain the stage 210 at the ground potential without applying a bias and maintain the trap plate in a floating state. In this case, ions in the plasma PLM generated in the plasma chamber 213 directly pass through the holes of the trap plate and, while being accelerated to the stage 210 side, are radiated to the substrate W1 or W2 placed on the stage 210. Thus, treatment similar to the RIE treatment is to be performed. When the trap plate is maintained at the ground potential, ions are trapped by the trap plate and only radicals pass through the trap plate and are radiated to the substrate W1 or W2 placed on the stage 210. Thus, it becomes possible to, while achieving a configuration in which the bias applier 217 applying a bias to the stage 210 is omitted, perform treatment similar to the RIE treatment and the radical treatment. In addition, in the treatment similar to the RIE treatment, it is possible to subject the substrates W1 and W2 to so-called weak etching treatment.

Note that the afore-described configuration in which, at the time of the RIE treatment, the trap plate is put into a floating state instead of being maintained at the ground potential and, only at the time of the radical treatment, the trap plate is maintained at the ground potential or the afore-described configuration that maintains the stage 210 at the ground potential without applying a bias and maintains the trap plate in a floating state is not limited to application to the activation treatment device using so-called ICP plasma and may be applied to the activation treatment device using a microwave that was described using FIG. 17 or an activation treatment device of parallel flat plate type. In this case, it is possible to achieve a more inexpensive configuration. Note that examples of the activation treatment device of parallel flat plate type include an activation treatment device 6002, as illustrated in, for example, FIG. 18, that includes an electrode 6215 arranged in a plasma chamber 213, a bias applier 6216 to apply a bias to the electrode 6215, and a trap plate 5214. In this configuration, ions in plasma are also trapped in an electric field in a sheath region in a similar manner to ICP plasma. In addition, although the frequency of a bias is 13.56 MHz in the RIE treatment, use of a bias with a frequency of 27 MHz or use of a 2 GHz microwave as in the activation treatment device of parallel flat plate type or the activation treatment device using ICP plasma enables a larger number of radicals to be generated and is more effective.

In the afore-described activation treatment device, ions in the plasma PLM are trapped in a sheath region formed in the plasma chamber 213 or an electric field formed by the induction coil 215 and do not fall to the stage 210 side. Thus, when the trap plate is maintained at the ground potential, ions in the plasma PLM are drawn in to the trap plate and accelerated, when passing through holes of the trap plate, receive electrons from the trap plate, and, while being kept accelerated as neutral molecules, are radiated to the substrate W1 or W2 placed on the stage 210. Thus, it is possible to reduce damage to the substrate W1 or W2 due to charge up by ions. In addition, since setting the trap plate to a floating state causes ions in the plasma PLM to be maintained in a state of being trapped in a sheath region formed in the plasma chamber 213 or an electric field formed by the induction coil 215, it becomes possible to perform chemical treatment enabled by causing only radicals in the plasma PLM to pass through the trap plate and fall to the stage 210 side.

That is, it becomes possible to perform incremental application of activation treatments in such a manner that, as described afore, (1) so-called strong physical treatment in which the trap plate is set to a floating state and a bias is applied to the stage 210, (2) so-called weak physical treatment in which, while the trap plate is set to a floating state, the stage 210 is maintained at the ground potential, and (3) weak physical treatment in which the trap plate 4214 is maintained at the ground potential and neutral radicals are radiated to the substrate W1 or W2 and that causes a small damage are performed in this order. In addition, (4) chemical treatment that, by maintaining the trap plate at the ground potential, causes radicals to flow down and (5) chemical treatment that, with the trap plate set to a floating state, processes radicals are also applicable. Further, three methods, namely a method of first performing the strongest physical treatment (1) and next performing the chemical treatment (4), a method of first performing the weak physical treatment (2) and next performing the chemical treatment (4), and a method of first performing the weak physical treatment (5) that causes a small damage to the substrate W1 or W2 and next performing the chemical treatment (4), are conceivable, and it becomes possible to select one of the three methods and perform the selected one.

In addition, in the afore-described respective variations, the configuration is not limited to a configuration in which the trap plate or the stage 210 is maintained at the ground potential, and bias voltage may be applied to the trap plate or the stage 210. Because of this configuration, ions passing through the trap plate are further accelerated and energy of the ions can be increased.

Although, in the embodiment, an example in which both of the two substrates W1 and W2 are subjected to the $N_2$ RIE treatment and the $N_2$ radical treatment was described, the method of activation treatment is not limited to this method as long as both of bonding surfaces of the two substrates W1 and W2 are subjected to the activation treatment. For example, it may be configured such that only one of the two substrates W1 and W2 is subjected to the $N_2$ RIE treatment and the $N_2$ radical treatment and the other is not subjected to at least one of the $N_2$ RIE treatment and the $N_2$ radical treatment.

In the embodiment, an example in which the substrate bonding device 1 applies pressure to the substrates W1 and W2 and also subjects the substrates W1 and W2 to heat treatment with the entire bonding surfaces of the substrates W1 and W2 in contact with each other was described. However, the present disclosure is not limited to the example, and it may be configured such that the substrate bonding device 1 only applies pressure to the substrates W1 and W2 with the entire bonding surfaces of the substrates W1 and W2 in contact with each other and does not perform heat treatment.

Alternatively, it may be configured such that the substrate bonding device 1 only subjects the substrates W1 and W2 to heat treatment with the entire bonding surfaces of the substrates W1 and W2 in contact with each other and does not apply pressure to the substrates W1 and W2. In addition, the substrates W1 and W2 may be subjected to application of pressure and heat treatment in a device different from the substrate bonding device 1. For example, the substrate bonding device 1 may perform processing until the temporary bonding of the substrates W1 and W2 and the heat treatment may be subsequently performed in another heating device (not illustrated).

Although, in the embodiment, a configuration in which the substrates W1 and W2 are bonded to each other in a vacuum was described, the present disclosure is not limited to the configuration, and it may be configured such that the substrates W1 and W2 are bonded to each other under atmospheric pressure, and, alternatively, it may be configured such that the substrates W1 and W2 are bonded to each other under an atmosphere filled with an arbitrary gas.

Although, in the embodiment, a configuration in which a cooling device that cools the stage for supporting the substrate W1 or W2 is disposed in the load lock chamber 83 was described, the present disclosure is not limited to the configuration, and it may be configured such that no cooling device is disposed in the load lock chamber 83. Although, in the afore-described variation, an example in which the activation treatment device 3002 includes the particle beam source 3061 was described, the present disclosure is not limited to the example, and it may be configured such that the turnover device 4 includes a particle beam source.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-164962, filed on Sep. 30, 2020, the entire disclosure of which is incorporated by reference herein.

INDUSTRIAL APPLICABILITY

The present disclosure is suitable for manufacturing of, for example, complementary MOS (CMOS) image sensors, memories, arithmetic elements, or micro electro mechanical systems (MEMS).

REFERENCE SIGNS LIST

1 Substrate bonding device
2, 3002, 4002, 5002, 6002 Activation treatment device
3 Cleaning device
4 Turnover device
9 Controller
82 First transportation device
83 Load lock chamber
84 Second transportation device
120, 212, 3212, 4212 Chamber
121, 201 Vacuum pump
122B, 202A Exhaust pipe
123B, 203A Exhaust valve
141, 210, 3210 Stage
142 Head
143, 3623 Stage driver
144 Head driver
148 Pressure sensor
150 Misalignment amount measurer
213, 3213 Plasma chamber
215 Induction coil
216 High-frequency power source
217, 6216 Bias applier
220A Nitrogen gas feeder
220B Oxygen gas feeder
221A Nitrogen gas storage
221B Oxygen gas storage
222A, 222B Feeding valve
223A, 223B Feeding pipe
811, 812 Feeding port
813 Take-out port
821, 841 Transportation robot
1411, 1421 Substrate heater
3061 Particle beam source
3063 Beam source transporter
3212a Hole
3611, 6215 Electrode
3612 Discharge chamber
3612a FAB radiation port
3613 Beam source driver
3614 Gas feeder
3631 Support rod
3632 Support base
3633 Support base driver
3634 Bellows
4213 Glass window
4214, 5214 Trap plate
4215 Waveguide
4216 Magnetron
BL1 Blade
W1, W2 Substrate

The invention claimed is:

1. A substrate bonding method for bonding two substrates formed of an insulating material containing no metallic element, the method comprising:
an activation treatment step of, by subjecting at least one of bonding surfaces to be bonded to each other of respective ones of the two substrates to at least one of etching treatment using nitrogen gas and irradiation of nitrogen radicals, bringing the bonding surface into a state where a nitrogen oxide has been formed thereon;
a gas exposure step of, after the activation treatment step, by exposing the bonding surfaces of the two substrates to gas containing water within a preset standard time less than 10 min during which the state does not disappear, replacing the nitrogen oxide by OH groups; and
a bonding step of bonding the two substrates that have the bonding surfaces on which the OH groups exist through the activation treatment step.

2. The substrate bonding method according to claim 1, wherein, in the bonding step, the substrate bonding method bonds the two substrates while gas pressure is greater than 1 Pa and less than 10000 Pa.

3. The substrate bonding method according to claim 1 further comprising a transportation step of, during a period after the gas exposure step until the bonding step is performed, transporting the two substrates while maintaining gas pressure greater than 1 Pa and less than 10000 Pa.

4. The substrate bonding method according to claim 1 further comprising a cleaning step of cleaning the bonding surface of at least one of the two substrates, the one having the bonding surface hydrophilized, by spraying fluid containing water on the bonding surface.

5. The substrate bonding method according to claim 1, wherein, at least one of at a point after the activation treatment step and before a transportation step of transporting the two substrates and in the transportation step, the substrate bonding method feeds water gas to the bonding surfaces of the two substrates.

6. The substrate bonding method according to claim 1, wherein, in the activation treatment step, the substrate bonding method, after subjecting the bonding surfaces of the two substrates to reactive ion etching using nitrogen gas, subjects the bonding surfaces of the two substrates to radical treatment in which the bonding surfaces of the two substrates are irradiated with nitrogen radicals.

7. The substrate bonding method according to claim 6, wherein, in the activation treatment step, the substrate bonding method, before subjecting the bonding surfaces of the two substrates to reactive ion etching using nitrogen gas, subjects the bonding surfaces of the two substrates to reactive ion etching using oxygen gas.

8. The substrate bonding method according to claim 1, wherein, in the activation treatment step, the substrate bonding method, after subjecting the bonding surfaces of the two substrates to etching treatment in which the bonding surfaces of the two substrates are irradiated with a particle beam using nitrogen gas, subjects the bonding surfaces of the two substrates to radical treatment in which the bonding surfaces of the two substrates are irradiated with nitrogen radicals.

9. The substrate bonding method according to claim 6, wherein, in the radical treatment, the substrate bonding method causes ions and radicals in plasma generated on one surface side in a thickness direction of a trap plate, the trap plate having at least one hole penetrating through the trap plate and being maintained at a ground potential, to pass through the hole of the trap plate and to be radiated to a bonding surface of at least one of the two substrates, the one being arranged on the other surface side in a thickness direction of the trap plate.

10. The substrate bonding method according to claim 6, wherein
in the etching treatment, the substrate bonding method maintains a trap plate, the trap plate having at least one hole penetrating through the trap plate, in a floating state, generates plasma on one surface side in a thickness direction of the trap plate, and arranges at least one of the two substrates on the other surface side in a thickness direction of the trap plate, and
in the radical treatment, the substrate bonding method maintains the trap plate at a ground potential.

11. The substrate bonding method according to claim 8, wherein, on a bonding surface of at least one of the two substrates, a metal portion and an insulating film are exposed.

12. The substrate bonding method according to claim 1, wherein, on a bonding surface of at least one of the two substrates, an insulating film formed by depositing an oxide or a nitride is exposed.

13. A substrate bonding method for bonding two substrates formed of an insulating material containing no metallic element, the method comprising:
an activation treatment step of, by subjecting at least one of bonding surface to be bonded to each other of respective ones of the two substrates to at least one of etching treatment using nitrogen gas and irradiation of nitrogen radicals, bringing the bonding surfaces into a state where a nitrogen oxide has been formed thereon;
a gas exposure step of, after the activation treatment step, by exposing the bonding surfaces of the two substrates to gas containing water within a preset standard time during which the state does not disappear, replacing the nitrogen oxide by OH groups; and
a bonding step of bonding the two substrates that have the bonding surfaces on which the OH groups exist through the activation treatment step,
wherein, in the bonding step, the substrate bonding method bonds the two substrates while gas pressure is greater than 1 Pa and less than 10000 Pa.

14. A substrate bonding method for bonding two substrates formed of an insulating material containing no metallic element, the method comprising:
an activation treatment step of, by subjecting at least one of bonding surfaces to be bonded to each other of respective ones of the two substrates to at least one of etching treatment using nitrogen gas and irradiation of nitrogen radicals, bringing the bonding surface into a state where a nitrogen oxide has been formed thereon;
a gas exposure step of, after the activation treatment step, by exposing the bonding surfaces of the two substrates to gas containing water within a preset standard time during which the state does not disappear, replacing the nitrogen oxide by OH groups; and
a bonding step of bonding the two substrates while OH groups exist on the bonding surfaces,
wherein, in the bonding step, the substrate bonding method bonds the two substrates under a gas pressure greater than a gas pressure in the activation treatment step.

15. A substrate bonding method for bonding two substrates formed of an insulating material containing no metallic element, the method comprising:
an activation treatment step of, by subjecting at least one of bonding surface to be bonded to each other of respective ones of the two substrates to at least one of etching treatment using nitrogen gas and irradiation of nitrogen radicals, forming a nitrogen oxide on the bonding surfaces;
a gas exposure step of, after the activation treatment step, by exposing the bonding surfaces of the two substrates to gas containing water while maintaining a state where the nitrogen oxide is formed on the bonding surfaces, replacing the nitrogen oxide formed on the bonding surfaces by OH groups; and
a bonding step of bonding the two substrates while the OH groups exist on the bonding surfaces.

\* \* \* \* \*